(12) United States Patent
Gregory et al.

(10) Patent No.: US 9,520,481 B2
(45) Date of Patent: Dec. 13, 2016

(54) ELECTRONIC DEVICES

(71) Applicant: Pragmatic Printing Ltd, Cambridge (GB)

(72) Inventors: John James Gregory, March (GB); Richard David Price, Manchester (GB)

(73) Assignee: Pragmatic Printing Limited, Sedgefield, Durham (GB)

( * ) Notice: Subject to any disclaimer, the term of this patent is extended or adjusted under 35 U.S.C. 154(b) by 1 day.

(21) Appl. No.: 14/378,920

(22) PCT Filed: Feb. 13, 2013

(86) PCT No.: PCT/GB2013/050337
§ 371 (c)(1),
(2) Date: Aug. 14, 2014

(87) PCT Pub. No.: WO2013/121195
PCT Pub. Date: Aug. 22, 2013

(65) Prior Publication Data
US 2016/0020299 A1   Jan. 21, 2016

(30) Foreign Application Priority Data

Feb. 14, 2012 (GB) ................................. 1202544
Aug. 13, 2012 (GB) ................................. 1214438

(51) Int. Cl.
*H01L 29/06*   (2006.01)
*H01L 29/66*   (2006.01)
(Continued)

(52) U.S. Cl.
CPC ..... *H01L 29/66477* (2013.01); *H01L 27/1266* (2013.01); *H01L 29/66757* (2013.01); *H01L 29/66765* (2013.01); *G03F 7/2022* (2013.01)

(58) Field of Classification Search
CPC ........... H01L 27/1288; H01L 29/66757; H01L 21/268; H01L 21/0272; H01L 21/823418; H01L 27/088; H01L 29/42344; G03F 7/2022
(Continued)

(56) References Cited

U.S. PATENT DOCUMENTS 4,218,532 A * 8/1980 Dunkleberger ......... G03F 7/094
                                                         216/40
6,380,009 B1   4/2002 Battersby
(Continued)

FOREIGN PATENT DOCUMENTS

| JP | H02 62050 A | 3/1990 |
| JP | H04 75350 A | 3/1992 |
| WO | WO2007/110671 A3 | 3/2007 |

OTHER PUBLICATIONS

United Kingdom Intellectual Property Office, Search Report for Great Britain Application No. GB1214438.2, Dec. 13, 2012, 3 pages.
(Continued)

*Primary Examiner* — Caleen Sullivan
(74) *Attorney, Agent, or Firm* — Klarquist Sparkman, LLP

(57) ABSTRACT

A method of manufacturing an electronic device comprising a first terminal (e.g. a source terminal), a second terminal (e.g. a drain terminal), a semiconductor channel connecting the first and second terminals and a gate terminal to which a potential may be applied to control a conductivity of the channel. The method comprises a first exposure of a photoresist from above the substrate using a mask and a second exposure from below, wherein in the second exposure the first and second terminals shield a part of the photoresist from exposure. An intermediate step reduces the solubility of the photoresist exposed in the first exposure. A window is
(Continued)

formed in the photoresist at the location which was shielded by the mask, but exposed to radiation from below. Semiconductor material, dielectric material and conductor material are deposited inside the window to form a semiconductor channel, gate dielectric, and a gate terminal, respectively.

30 Claims, 24 Drawing Sheets

(51) Int. Cl.
    *H01L 27/12*     (2006.01)
    *G03F 7/20*     (2006.01)

(58) Field of Classification Search
    USPC .......................................... 430/315, 314, 394
    See application file for complete search history.

(56) References Cited

U.S. PATENT DOCUMENTS

| | | |
|---|---|---|
| 2009/0166612 A1 | 7/2009 | Cain et al. |
| 2010/0117071 A1 | 5/2010 | Inoue et al. |
| 2010/0264410 A1 | 10/2010 | Nomoto et al. |
| 2011/0042667 A1 | 2/2011 | Kawamura et al. |

OTHER PUBLICATIONS

International Search Report and Written Opinion of the International Searching Authority, mailed May 14, 2013, for corresponding International Application No. PCT/GB2013/050337, 14 pages.

International Preliminary Report on Patentability and Written Opinion of the International Searching Authority, mailed Aug. 28, 2014, for corresponding International Application No. PCT/GB2013/050337, 9 pages.

* cited by examiner

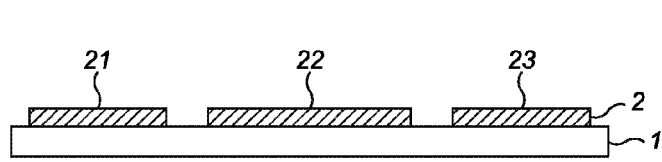
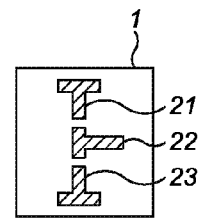
FIG. 11a              FIG. 11b
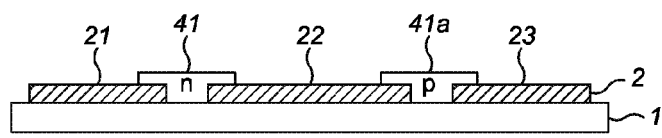
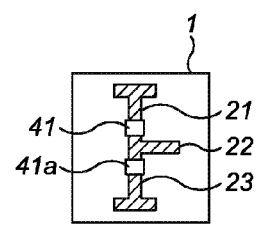
FIG. 11c              FIG. 11d
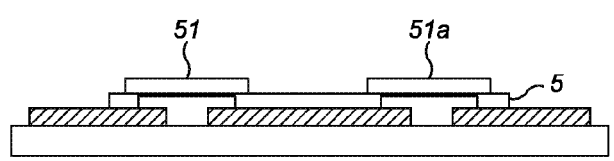
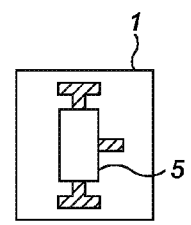
FIG. 11e              FIG. 11f
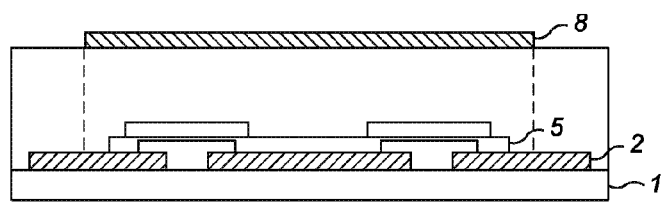
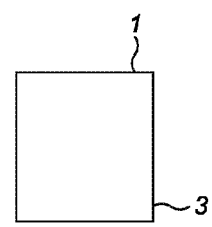
FIG. 11g              FIG. 11h

ELECTRONIC DEVICES

CROSS REFERENCE TO RELATED APPLICATIONS

This is the U.S. National Stage of International Application No. PCT/GB2013/050337, filed Feb. 13, 2013, which in turn claims the priority to Great Britain Application Nos. GB1202544.1, filed Feb. 14, 2012 and GB1214438.2, filed Aug. 13, 2012.

FIELD OF THE INVENTION

The present invention relates to electronic devices and their manufacture. In particular, although not exclusively, the present invention relates to electronic devices, such as transistors, manufactured using techniques exploiting the properties of image-reversal photoresist material.

BACKGROUND TO THE INVENTION

A variety of electronic devices incorporating first and second terminals connected by a semiconductor channel, and a gate terminal arranged with respect to the channel to control its conductivity, are known. A variety of techniques for manufacturing such electronic devices are also known. In certain of these techniques, it is desirable to manufacture the gate terminal such that it is accurately aligned in respect to the channel, so that a voltage (i.e. electric potential) can be applied to the gate terminal to control the channel conductivity to such an extent that it can effectively be switched off (i.e. such that charge flow along the channel, from one terminal to the other can be completely prevented). One known technique for producing a gate structure accurately aligned with respect to the gap between source and drain terminals of a transistor, and to the semiconductor channel bridging that gap, is to use the source and drain terminals themselves as a mask, and expose a photosensitive layer provided above the structure to radiation (such as UV radiation) from below. The exposed resist material can then be developed to remove it, forming a window in which a gate dielectric layer and then a conductive layer can be deposited to form the gate dielectric and gate terminal respectively. Such a technique is disclosed in WO 2007/110671 A2 for example. Although such techniques can provide a gate terminal accurately positioned with respect to the semiconductor channel and gap between the source and drain terminals, the problem is that gate material can be deposited over a large area, and/or there can be substantial overlap between the gate terminal and the source and drain terminals. Large overlaps are undesirable as they tend to result in large parasitic capacitances. Furthermore, it is in general undesirable to have gate terminals larger than necessary. Removal of unwanted gate material after its initial deposition represents an additional processing step, which it would be desirable to avoid if possible. WO 2007/110671 A2 discloses some attempted solutions, but these typically necessitate the positioning of a separate mask with respect to the fabricated structure whilst that structure then undergoes selective removal of gate layer material. WO 2007/110671 discloses another technique in which excessively large gate terminals may be avoided, but this involves the positioning of a shadow-mask with respect to the source-drain structure, beneath the structure, during exposure of the structure to UV radiation. The correct positioning of this shadow-mask with respect to the structure being processed represents an additional complication to the fabrication technique. Furthermore, the mask, which is separate from the structure being processed, must be held in position during the irradiation process.

Thus, WO 2007/110671 discloses a technique in which a source-drain pattern is produced, and then a reverse side exposure is used to pattern a photoresist using the source and drain as a mask. This can produce a self-aligned gate, but has the drawback that the areas not shielded by the source-drain patterns are exposed. The gate pattern may be deposited by solution processing.

SUMMARY OF THE INVENTION

It is an object of certain embodiments of the invention to solve, mitigate, or obviate, at least partly, at least one of the problems and/or disadvantages associated with the prior art. Certain embodiments aim to provide at least one of the advantages described below.

According to a first aspect of the present invention there is provided a method of manufacturing an electronic device comprising a first terminal (e.g. a source terminal), a second terminal (e.g. a drain terminal), a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing at least a substrate and said first and second terminals supported, either directly or indirectly, by the substrate, the first and second terminals being separated by a gap, and the first and second terminals and the gap being located over a first region of the substrate and within a perimeter of the first region;

b) forming a covering (e.g. a layer or plurality of layers) of photoresist material over at least the first region of the substrate so as to cover the first and second terminals, the gap, and any portion or portions of the first region of the substrate not located beneath the gap or the first and second terminals;

c) forming a mask on a surface of the covering of photoresist material, the mask covering at least a portion of the gap extending from the first terminal to the second terminal, at least a portion of the first terminal immediately adjacent said portion of the gap, and at least a portion of the second terminal immediately adjacent said portion of the gap;

d) exposing the structure resulting from step (c) to electromagnetic radiation from above such that the mask shields a portion of the photoresist covering under the mask from said electromagnetic radiation;

e) processing the structure resulting from step (d) to reduce (i.e. selectively reduce) a solubility of the photoresist material exposed to said electromagnetic radiation from above (and, in certain embodiments, at the same time render the exposed photoresist material substantially chemically insensitive to further exposure to electromagnetic radiation, i.e. at least substantially reduce the chemical sensitivity of the exposed photoresist material to further exposure to electromagnetic radiation);

f) exposing the structure resulting from step (e) to electromagnetic radiation from below, such that the first and second terminals shield parts of the previously unexposed portion of photoresist covering from the electromagnetic radiation from below but another part of the previously unexposed portion of photoresist covering is exposed (e.g. via the gap);

g) processing the photoresist material to remove photoresist material that was shielded by the mask from the electromagnetic radiation from above but exposed to electromagnetic radiation from below, to form a window in the covering of photoresist material; and h) depositing at least one of: a layer of semiconductor material; a layer of dielectric material; and a layer of conductor material, at least inside said window, to form at least one of: the semiconductor channel, gate dielectric, and gate terminal, respectively.

Thus, in embodiments of this first aspect of the invention, the first and second terminals are provided and are formed from material that is at least substantially opaque to the electromagnetic radiation used to expose the photoresist material. The method uses masking (provided by the mask, and the first and second terminals) and exposure to electromagnetic radiation from above and below to form a window, inside which a gate terminal can be deposited. The method results in accurate alignment between the gate terminal and each of the first and second terminals, with minimal overlap, and also defines the extent of the gate terminal. This accurate alignment of the gate is achieved without requiring accurate alignment of the mask with respect to the first and second terminals.

In certain embodiments the method further comprises removing the mask before step (g), and this removal of the mask may be a sub-step of step (d), performed after exposing the structure resulting from step (c) to radiation. Thus, the mask may be removed before subsequent processing In certain embodiments, the method further comprises removing remaining material of the photoresist covering after step (h). This may uncover at least portions of the first and second terminals, to enable contacts to be made to them.

In certain embodiments, step (a) comprises providing said substrate, a layer of semiconductor material supported by the substrate, and said first and second terminals supported directly by the layer of semiconductor material. In such embodiments, step (h) may comprise depositing a layer of dielectric material and a layer of conductor material, at least inside said window, to form the gate dielectric and the gate terminal.

In certain embodiments, step (a) comprises providing said substrate, a layer of semiconductor material supported by the substrate, said first and second terminals supported directly by the layer of semiconductor material, and a layer of dielectric material covering at least the semiconductor material under said gap. In such embodiments, step (h) may comprise depositing a layer of conductor material, at least inside said window, to form the gate terminal.

In certain embodiments step (a) comprises providing said substrate, said first and second terminals supported directly by the substrate, a layer of semiconductor material covering at least said gap, and a layer of dielectric material covering at least the semiconductor material covering said gap. In such embodiments, step (h) may comprise depositing a layer of conductor material, at least inside said window, to form the gate terminal.

In certain embodiments the method further comprises using the gate terminal as a mask in a processing step to remove semiconductor material and/or dielectric material not covered by the gate terminal. Advantageously, this trimming of semiconductor and/or dielectric material can therefore be achieved without requiring any additional mask to be provided. The trimming can be achieved using the already-formed, and accurately aligned mask.

In certain embodiments step (a) comprises providing said substrate, and said first and second terminals supported directly by said substrate. In such embodiments, step (h) may comprise depositing a layer of semiconductor material; a layer of dielectric material; and a layer of conductor material, at least inside said window, to form the semiconductor channel, gate dielectric, and gate terminal, respectively.

In certain embodiments said covering of photoresist material comprises a plurality of layers of photoresist material. For example, the covering of photoresist material in certain embodiments comprises a first (e.g. lower) layer of a first photoresist material, and a second (e.g. upper) layer of a second, different photoresist material. The first photoresist material may be a lift-off resist material.

In certain embodiments the method further comprises forming an undercut in the first layer of photoresist material inside said window before step (h). In other words, the side walls of photoresist material defining the edges of the window (i.e. bounding the window) may be undercut. This provides the advantage of separating the gate material deposited inside the window, for example, from any gate material (i.e. conductor material) deposited on the photoresist covering around the window. When the remaining photoresist material is removed (e.g. by a lift-off process), only the gate material that was deposited inside the window remains.

According to a second aspect of the invention, there is provided a method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing at least a substrate, said gate terminal, a layer of semiconductor material, and a layer of dielectric material separating the gate terminal from the layer of semiconductor material, the gate terminal being supported, either directly or indirectly, by the substrate, the layer of semiconductor material comprising a channel portion, arranged over said gate terminal, a first end portion, extending from a first end of the channel portion beyond an edge of the gate terminal, and a second end portion, extending from a second end of the channel portion beyond an edge of the gate terminal, the channel portion providing said semiconductor channel and the layer of dielectric material providing said gate dielectric, and the gate terminal and the layer of semiconductor material being located over a first region of the substrate and within a perimeter of the first region;

b) forming a covering (e.g. a layer or a plurality of layers) of photoresist material over at least the first region of the substrate so as to cover the gate terminal and the layer of semiconductor material and any portion or portions of the first region of the substrate not located beneath the gate or the layer of semiconductor material;

c) forming a mask on a surface of the covering of photoresist material, the mask covering the channel portion, at least part of the first end portion, and at least part of the second end portion;

d) exposing the structure resulting from step (c) to electromagnetic radiation from above such that the mask shields a portion of the photoresist covering under the mask from said electromagnetic radiation;

e) processing the structure resulting from step (d) to reduce (i.e. selectively reduce) a solubility of the photoresist material exposed to said electromagnetic radiation from above (and, in certain embodiments, at the same time to render the exposed photoresist material substantially chemically insensitive to further exposure to electromagnetic radiation:

f) exposing the structure resulting from step (e) to electromagnetic radiation from below, such that the gate terminal shields a part of the previously unexposed portion of photoresist covering from the electromagnetic radiation from below but other parts of the previously unexposed portion of photoresist covering are exposed;

g) processing the photoresist material to remove photoresist material that was shielded by the mask from the electromagnetic radiation from above but exposed to electromagnetic radiation from below, to form a first window in the covering of photoresist material, the first window exposing at least part of the first end portion, and a second window in the covering of photoresist material, the second window exposing at least part of the second end portion; and h) depositing conductor material, at least inside said first and second windows, to form said first and second terminals respectively, the first terminal being in contact with the first end portion and the second terminal being in contact with the second end portion.

Thus, in embodiments of this second aspect of the invention, the gate terminal is provided and is formed from material that is at least substantially opaque to the electromagnetic radiation used to expose the photoresist material. The method uses masking (provided by the mask, and the gate terminal) and exposure to electromagnetic radiation from above and below to form separate windows, inside which the first and second terminals can be deposited respectively. The method results in accurate alignment between the gate terminal and each of the first and second terminals, with minimal overlap, and also defines the extent of each of the first and second terminals. This accurate alignment of the first and second terminals to the gate is achieved without requiring accurate alignment of the mask with respect to the gate terminal.

In certain embodiments of this second aspect the method further comprises removing the mask before step (g). For example, step (d) may comprise a sub-step of removing the mask after exposing the structure resulting from step (c).

In certain embodiments of the second aspect, the method further comprises removing remaining material of the photoresist covering after step (h).

In certain embodiments of the second aspect, the covering of photoresist material comprises a plurality of layers of photoresist material. For example, the covering may comprise a first (lower) layer of a first photoresist material, and a second (upper) layer of a second, different photoresist material, and the first photoresist material may be a lift-off resist material.

In certain embodiments of the second aspect, the method further comprises forming an undercut in the first layer of photoresist material inside each window before step (h).

According to a third aspect of the present invention, there is provided a method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing a structure comprising a substrate, said first and second terminals supported, either directly or indirectly, by the substrate, and separated by a gap, a layer of semiconductor material providing the semiconductor channel extending across said gap, a layer of dielectric material covering the layer of semiconductor material to provide the gate dielectric, and a layer gate material covering the first and second terminals and the layers of semiconductor material and dielectric material;

b) forming a covering of photoresist material covering at least the layer of gate material;

c) forming a mask on a surface of the covering of photoresist material, the mask extending at least fully across a width of the semiconductor channel and covering a portion of the first terminal and a portion of the second terminal;

d) exposing the structure resulting from step (c) to electromagnetic radiation from above such that the mask shields a portion of the photoresist covering under the mask from said electromagnetic radiation;

e) processing the structure resulting from step (d) to remove the photoresist material exposed to said electromagnetic radiation from above;

f) exposing the structure resulting from step (e) to electromagnetic radiation, to which the gate material is substantially transparent, from below, such that the first and second terminals shield parts of the previously unexposed portion of photoresist covering from the electromagnetic radiation from below but another part of the previously unexposed portion of photoresist covering is exposed (e.g. via the gap);

g) processing the structure resulting from step (f) to reduce the solubility of the photoresist material shielded from said electromagnetic radiation from above but exposed to said electromagnetic radiation from below;

h) exposing the structure resulting from step (g) to electromagnetic radiation from above so as to increase a solubility of the previously unexposed photoresist material;

i) processing the photoresist material to remove photoresist material that was shielded by the mask from the electromagnetic radiation from above, shielded by the first and second terminals from the electromagnetic radiation from below, and then exposed to electromagnetic radiation from above, so as to expose (i.e. uncover) all of the layer of transparent gate material except for a portion of the layer of gate material covered by the portion of photoresist material having been processed to reduce its solubility; and j) removing gate material not covered by said portion of photoresist material, the method further comprising removing the mask before step (h).

Thus, in embodiments of this third aspect of the invention, the first and second terminals are provided and are formed from material that is at least substantially opaque to the electromagnetic radiation used to expose the photoresist material. An extensive layer of gate material is also provided, and that gate material is at least substantially transparent to the electromagnetic radiation used to expose the photoresist material. The method uses masking (provided by the mask, and the first and second terminals) and exposure to electromagnetic radiation from above and below to leave photoresist material covering just the portion of gate material that is to form the gate terminal; the rest of the gate material layer is uncovered in the method, and then removed. As with the first and second aspects, the method of the third aspect results in accurate alignment between the gate terminal and each of the first and second terminals, with minimal overlap, and also defines the extent of the gate terminal. This accurate alignment of the gate is achieved without requiring accurate alignment of the mask with respect to the first and second terminals.

In certain embodiments of the third aspect, the removing of the mask is a sub-step of one of steps (d), (e), (f), and (g). For example, removing the mask may be a sub-step of step (d), performed after exposing said structure resulting from step (c).

According to a fourth aspect of the invention, there is provided a method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing at least a substrate, said gate terminal, a layer of semiconductor material, and a layer of dielectric material separating the gate terminal from the layer of semiconductor material, the gate terminal being supported, either directly or indirectly, by the substrate, the layer of semiconductor material comprising a channel portion, arranged over said gate terminal, a first end portion, extending from a first end of the channel portion beyond an edge of the gate terminal, and a second end portion, extending from a second end of the channel portion beyond an edge of the gate terminal, the channel portion providing said semiconductor channel and the layer of dielectric material providing said gate dielectric, and the gate terminal and the layer of semiconductor material being located over a first region of the substrate and within a perimeter of the first region;

b) forming a layer of conductor material over the first region of the substrate to cover the gate terminal, layer of dielectric material, and the layer of semiconductor material;

c) forming a covering (e.g. a layer or plurality of layers) of photoresist material covering the layer of conductor material;

d) forming a mask on a surface of the covering of photoresist material, the mask covering the channel portion, at least part of the first end portion, and at least part of the second end portion;

e) exposing the structure resulting from step (d) to electromagnetic radiation from above such that the mask shields a portion of the photoresist covering under the mask from said electromagnetic radiation;

f) processing the structure resulting from step (e) to remove the photoresist material exposed to said electromagnetic radiation from above and expose (i.e. uncover) conductor material not located under said mask;

g) exposing the structure resulting from step (f) to electromagnetic radiation, to which the conductor material is substantially transparent, from below, such that the gate terminal shield a part of the previously unexposed portion of photoresist covering from the electromagnetic radiation from below but other parts of the previously unexposed portion of photoresist covering are exposed;

h) processing the structure resulting from step (g) to reduce the solubility of the photoresist material shielded from said electromagnetic radiation from above but exposed to said electromagnetic radiation from below;

i) exposing the structure resulting from step (h) to electromagnetic radiation from above so as to increase a solubility of the previously unexposed photoresist material;

j) processing the photoresist material to remove photoresist material that was shielded by the mask from the electromagnetic radiation from above, shielded by the gate terminal from the electromagnetic radiation from below, and then exposed to electromagnetic radiation from above, so as to form a window in the layer of photoresist material exposing the surface of a portion of the layer of conductor material over the gate terminal; and removing exposed (i.e. uncovered) conductor material,
the method further comprising removing said mask before step (i).

Thus, in embodiments of this fourth aspect of the invention, the gate terminal is provided and is formed from material that is at least substantially opaque to the electromagnetic radiation used to expose the photoresist material. An extensive layer of conductor material is formed, and that conductor material is at least substantially transparent to the electromagnetic radiation used to expose the photoresist material. The method uses masking (provided by the mask, and the first and second terminals) and exposure to electromagnetic radiation from above and below to leave photoresist material covering just the separate portions of conductor material that are to form the first and second terminals respectively; the rest of the conductor material layer is uncovered in the method, and then removed. As with the first, second, and third aspects, the method of the fourth aspect results in accurate alignment between the gate terminal and each of the first and second terminals, with minimal overlap, and also defines the extent of the first and second terminals. This accurate alignment of the first and second terminals to the gate is achieved without requiring accurate alignment of the mask with respect to the gate terminal.

In certain embodiments of the fourth aspect, removing the mask is a sub-step of one of steps (e), (f), (g), and (h). For example, removing the mask may be a sub-step of step (e), performed after exposing said structure resulting from step (d).

It will be appreciated that features of each aspect of the present invention may be incorporated in one or more of the other aspects, with corresponding advantage.

In each of the above-mentioned aspects, said processing to reduce a solubility may comprise baking.

In each of the above-mentioned aspects said photoresist material may be an image-reversal photoresist material.

Another aspect of the present invention provides use of an image reversal photoresist material in the manufacture of an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, to achieve alignment between the first and second terminals and the gate terminal.

Another aspect of the present invention provides a method of manufacturing an electronic device, the method comprising use of image-reversal photoresist material to produce a self-aligned gate with respect to first and second terminals and a semiconductor channel, and to define an extent of the gate terminal.

Another aspect of the present invention provides a method of manufacturing an electronic device, the method comprising use of image-reversal photoresist material to produce a self-aligned gate with respect to first and second terminals and a semiconductor channel, and to define an extent of the first and second terminals.

Another aspect of the present invention provides a method of manufacturing an electronic device (e.g. a transistor) comprising a first terminal (e.g. a source terminal), a second terminal (e.g. a drain terminal), a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising:
  providing at least a substrate and said first and second terminals supported, either directly or indirectly, by the substrate, the first and second terminals being separated by a gap;
  forming a layer of photoresist material (e.g. image-reversal photoresist material) over the substrate so as to cover (either directly or indirectly) the first and second terminals, the gap, and regions of the substrate adjacent the gap and the first and second terminals;
  forming a mask on a surface of the layer of photoresist material, the mask covering the gap, portions of the first and second terminals adjacent the gap, and portions of the substrate adjacent the gap and adjacent said portions of the first and second terminals;
  exposing the resultant structure to electromagnetic radiation from above such that the mask shields a portion of the photoresist layer under the mask from said electromagnetic radiation;
  removing the mask;
  baking the resultant structure (or otherwise processing the structure such that the exposed portion of photoresist material becomes insensitive to further exposure);
  exposing the resultant structure to electromagnetic radiation from below, such that the first and second terminals shield parts of the previously unexposed portion of photoresist layer from the electromagnetic radiation from below but other parts of the previously unexposed portion of photoresist layer are exposed;
  developing the photoresist material to remove photoresist material that was shielded by the mask from the electromagnetic radiation from above but exposed to electromagnetic radiation from below, to form a window in the layer of photoresist material;
  depositing at least one of: a layers of semiconductor material; a layer of dielectric material; and a layer of conductor material, at least inside said window, to form at least one of: the semiconductor channel, gate dielectric, and gate terminal, respectively; and
  removing remaining material of the layer of photoresist material (e.g. to expose at least portions of the source and drain terminals).

Thus, in certain embodiments of the invention an image-reversal resist is used. A mask is crudely aligned over a source-drain structure and then exposed. The resist is baked and then exposed from the reverse; the resist which was under the mask becomes soluble and is then removed. Thus, certain embodiments of the invention use an image-reversal resist technique for the production of self-aligned gates.

It will be appreciated that in certain embodiments of the invention the baking effectively cures the exposed regions of resist (i.e. photoresist). There may be further curing from the UV exposure, but the resist becomes largely insensitive to further exposure.

In certain embodiments, the step of providing comprises providing said substrate, a layer of semiconductor material supported by the substrate, and said first and second terminals supported directly by the layer of semiconductor material.

In certain embodiments, the depositing comprises depositing a layer of dielectric material and a layer of conductor material, at least inside said window, to form the gate dielectric and the gate terminal.

In certain embodiments, the step of providing comprises providing said substrate, a layer of semiconductor material supported by the substrate, said first and second terminals supported directly by the layer of semiconductor material, and a layer of dielectric material covering at least the semiconductor material under (i.e. in) said gap, and said depositing comprises depositing a layer of conductor material, at least inside said window, to form the gate terminal.

In certain embodiments, the step of providing comprises providing said substrate, said first and second terminals supported directly by the substrate, a layer of semiconductor material supported by the substrate and said first and second terminals, and a layer of dielectric material covering at least the semiconductor material under (i.e. in) said gap, and said depositing comprises depositing a layer of conductor material, at least inside said window, to form the gate terminal.

In certain embodiments, the step of providing comprises providing said substrate, and said first and second terminals supported directly by said substrate.

In certain embodiments, in depositing the step comprises depositing a layer of semiconductor material; a layer of dielectric material; and a layer of conductor material, at least inside said window, to form the semiconductor channel, gate dielectric, and gate terminal, respectively.

Another aspect of the invention provides the use of image-reversal photoresist material in the manufacture of an electronic device having a self-aligned gate (that is a gate aligned to a semiconductor channel provided between first and second terminals). In certain embodiments of this use or method, an exposure from one side of the structure defines an overall extent or perimeter of the gate structure to be formed, and an exposure from the opposite side of the structure provides the accurate alignment between the gate structure and the terminals.

BRIEF DESCRIPTION OF THE DRAWINGS

Embodiments of the present invention will now be described with reference to the accompanying drawings, of which.

DETAILED DESCRIPTION OF EMBODIMENTS OF THE INVENTION

Figure 1A:
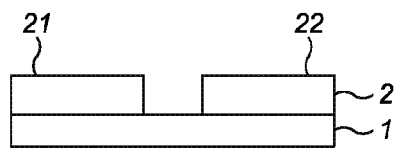
FIGS. 1a-1g illustrate steps in a method of manufacturing an electronic device in accordance with an embodiment of the invention.
Figure 1B:
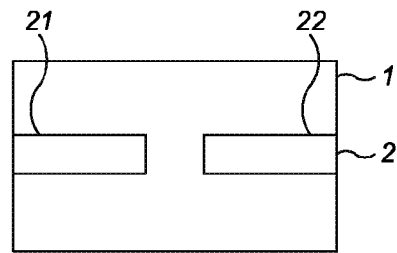
Figure 1C:
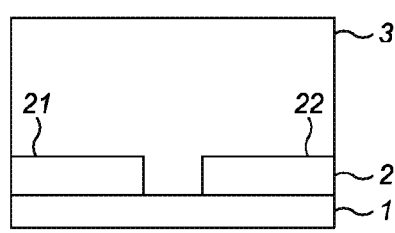
Figure 1D:
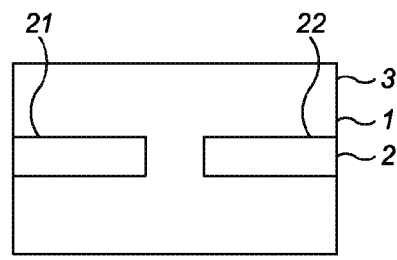
Figure 1E:
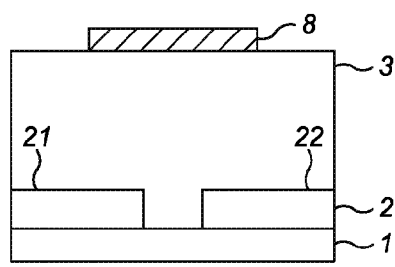
Figure 1F:
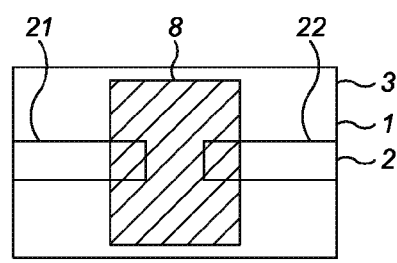
Figure 1G:
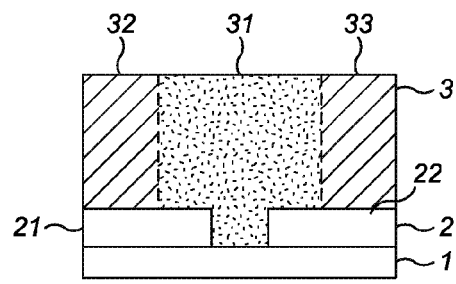
Figure 1H:
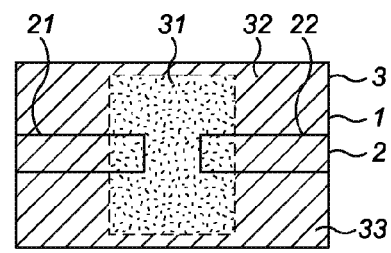
Figure 1I:
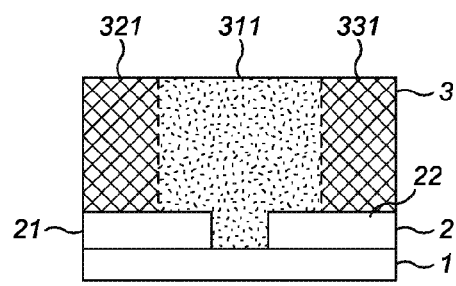
Figure 1J:
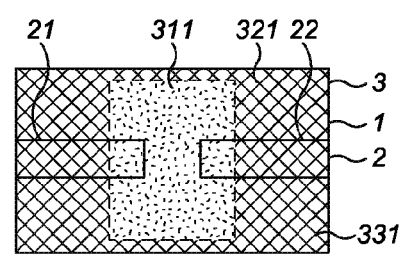
Figure 1K:
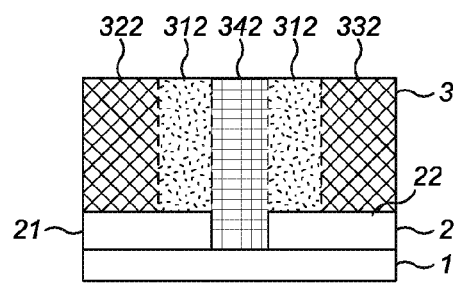
Figure 1L:
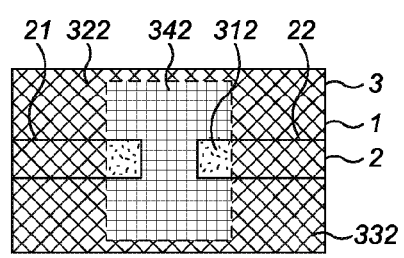
Figure 1M:
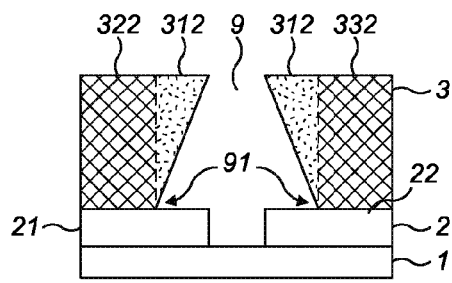
Figure 1N:
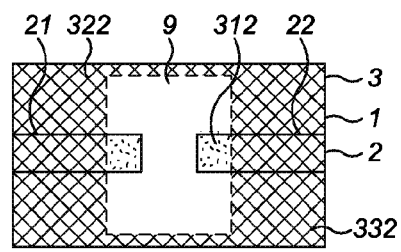
Figure 1O:
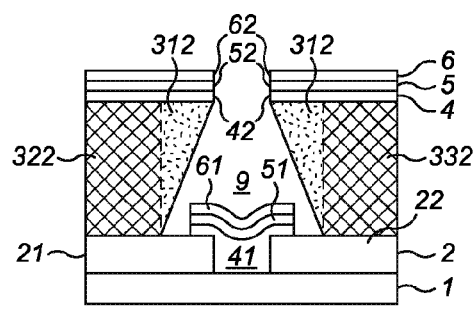
Figure 1P:
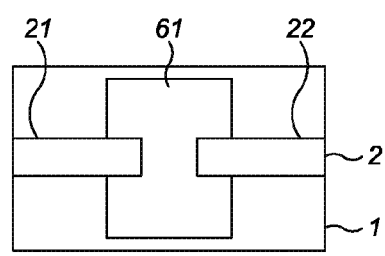
Figure 1Q:
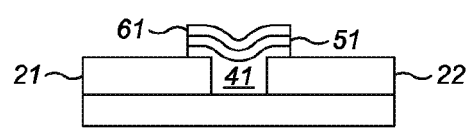
Figure 2:
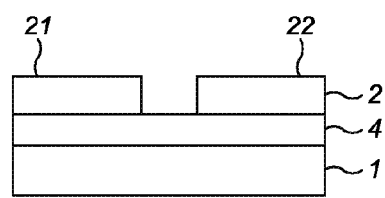
FIG. 2 illustrates an alternative structure which may be processed using a method embodying the invention to produce an electronic device embodying the invention.

Referring now to the accompanying figures, FIG. 1 shows a series of process steps using a method embodying the invention, and FIG. 2 shows a substrate with patterned source and drain contacts.

Referring now to FIG. 1, this shows a series of process steps using a method embodying the invention. FIG. 1a shows a substrate 1 on which a conductive material 2 has been deposited and patterned into regions 21 and 22. FIG. 1b shows a top-view of the configuration. FIG. 1c shows a further stage in the process where a layer of image-reversal photoresist material 3 has been deposited over the substrate 1, with FIG. 1d showing a top-view. FIG. 1e shows a subsequent stage where a mask 8 has been placed on top of resist 3 such that the opaque regions of mask 8 (shown in FIG. 1e) overlap a portion of both conductive region 21 and 22. FIG. 1f shows a top-view of the opaque regions of mask 8 overlapping conductive regions 21 and 22. FIG. 1g shows a further stage where the substrate has been exposed to UV radiation from above, such that the opaque regions of mask 8 prevent the UV radiation from penetrating into the resist 3 directly beneath. These unexposed regions 31 are separated from exposed regions 32 and 33. FIG. 1h shows a top-view following the topside exposure and removal of mask 8. FIG. 1i shows a further stage where the substrate has been baked in the process changing resist regions 32 and 33 such that they are now cross-linked regions 321 and 331. Resist region 31 has been baked to produce resist region 311. FIG. 1j shows a top-view of the substrate. FIG. 1k shows a further stage in which the substrate has been exposed to UV radiation from beneath the substrate. In this process the conductive regions 21 and 22 are opaque to the UV radiation, shielding resist 3 from the UV radiation. Resist region 311 is partially shielded from the UV radiation, resulting in unshielded resist regions 342 and shielded resist regions 312. Similarly resist regions 321 and 331 consist of shielded and unshielded regions, but the shielded regions of resist are unaffected by the UV exposure from beneath, such that these resist regions 322 and 332 have the same properties following the UV exposure. FIG. 1l shows a top-view of the substrate with the resist consisting of regions 312, 322, 332 and 342. FIG. 1m shows a further stage where the resist has been developed, in the process removing resist region 342 and leaving a window 9. Undercuts 91 have been created due to overexposure of the resist during the UV exposure from beneath. FIG. 1n shows a top-view of the substrate with window 9. FIG. 10 shows a further stage where a layer of semiconductor 4, dielectric 5 and conductor 6 has been deposited on top of substrate 1. Within window 9 this has created semiconductor region 41, dielectric region 51 and conductive region 61, whereas on top of resist regions 312, 322 and 332, this has created layers created semiconductor region 42, dielectric region 52 and conductive region 62. FIG. 1p shows a top-view of a further stage where remaining resist 3 has been removed by solvent lift-off and regions 42, 52 and 62 lifted-off at the same time. The substrate 1 now supports conductive regions 21 and 22, semiconductor region 41, dielectric region 51 and conductive region 61. FIG. 1q shows a side-view of the substrate and a completed thin-film transistor, consisting of source region 21, drain region 22, semiconductor region 41, dielectric region 51 and gate region 61.

Referring now to FIG. 2 this shows a substrate 1, with conductive layer 2 patterned into source 21 and drain 22 contacts. Beneath conductive layer 2 is semiconductor layer 4, which is transparent to UV radiation. Substrate 1 can be processed using the same series of steps in FIGS. 1c-1n. In this instance a layer of dielectric material 5 and conductive material 6 are required to provide the other layers of a thin-film transistor.

Figure 3:
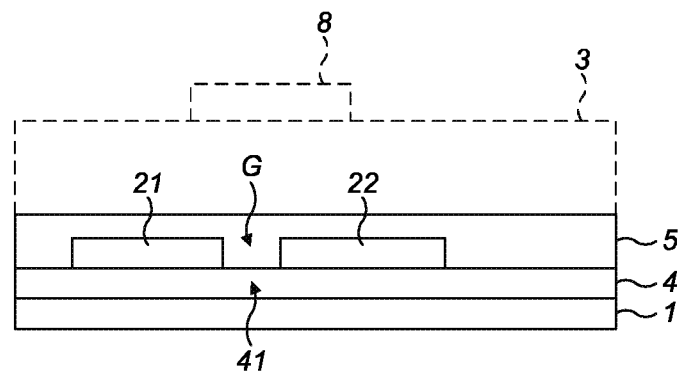
FIGS. 3-5 illustrate alternative structures which may be provided and then processed in methods embodying the invention to produce electronic devices embodying the invention.

Referring now to FIG. 3, this shows an alternative structure which can be provided in a method embodying the invention. A substrate 1 is provided, together with a layer of semiconductive material 4 directly supported by the substrate 1. Source and drain terminals 21 and 22 are provided on (i.e. supported by) the semiconductor layer 4, with a gap G between them. A portion of the semiconductor layer 4 underneath the gap G provides the semiconductor channel 41. A layer of dielectric material 5 covers the resultant structure, covering the source and drain terminals 21, 22, also covers the gap and fills the gap, and covers surrounding portions of the semiconductor layer 4. A layer of photoresist material (e.g. image-reversal resist material) is then formed over the structure, as shown by reference numeral 3. The initial mask 8 is also positioned as shown, in a subsequent processing step. The techniques described above in connection with FIG. 1 can be used to form a window through the resist layer 3. It will be appreciated that this technique requires the substrate 1, semiconductor 4 and dielectric material 5 to be at least partially transparent to the radiation being used to expose the photoresist.

After forming the window in the resist layer, gate material is deposited, at least inside the window, to form the gate terminal.

Figure 4:
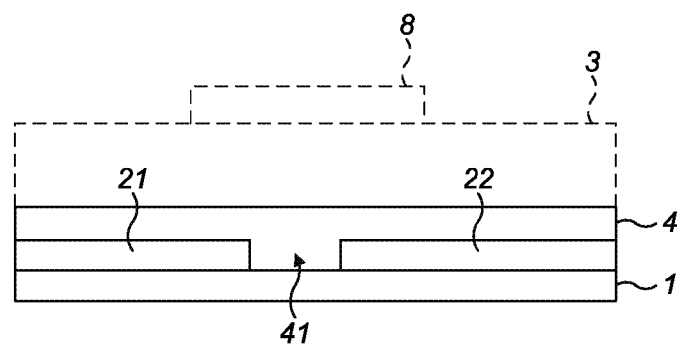

Referring now to FIG. 4, this illustrates an alternative "starting" structure. Here, a substrate 1 is provided, on which are directly supported first and second terminals 21, 22, with a gap G between them. A semiconductor layer 4 has been formed over the substrate 1, covering the terminals 21, 22 and filling the gap G. The semiconductor material 4 in the gap provides the semiconductor channel 41. Then, in a method embodying the invention, a layer of image-reversal resist material 3 is formed over the structure, and a mask 8 is initially formed on a surface of the resist layer. A technique generally as described above in relation to claim 1 is then used to form a window in the resist layer, into which a layer of dielectric material is first deposited, and then a layer of conductive material, to form the gate dielectric and gate terminal respectively. In this embodiment, the substrate 1, and semiconductor material 4 are selected to be at least partly transparent to the radiation being used to expose the resist layer.

Figure 5:
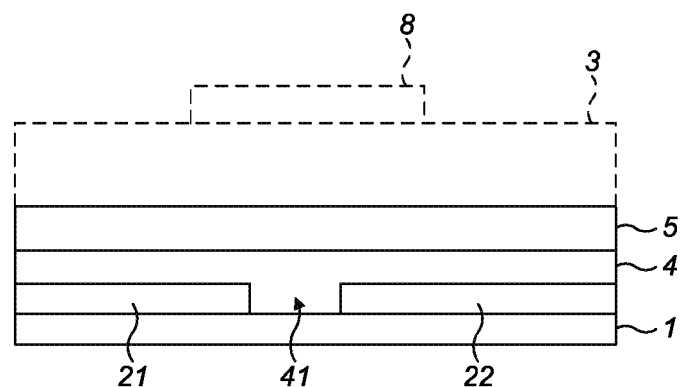

Referring now to FIG. 5, this shows yet another structure which may be used in embodiments of the invention. Here, a substrate 1 is provided, on which first and second terminals 21, 22 are directly supported. A layer of semiconductor material 4 covers the terminals and substrate and fills the gap between the terminals, thereby providing a semiconductor channel 41. A layer of dielectric material 5 is formed over the layer of the semiconductor. A layer of resist material 3 can then be formed over the structure, together with an initial mask 8. Techniques generally as described above can then be used to form a window through the resist layer, into which conductive material can be deposited to form a self-aligned gate terminal. In this embodiment, the substrate material 1, semiconductor 4, and dielectric material 5 are selected to be at least partially transparent to the radiation used to expose the photoresist.

Figure 6A:
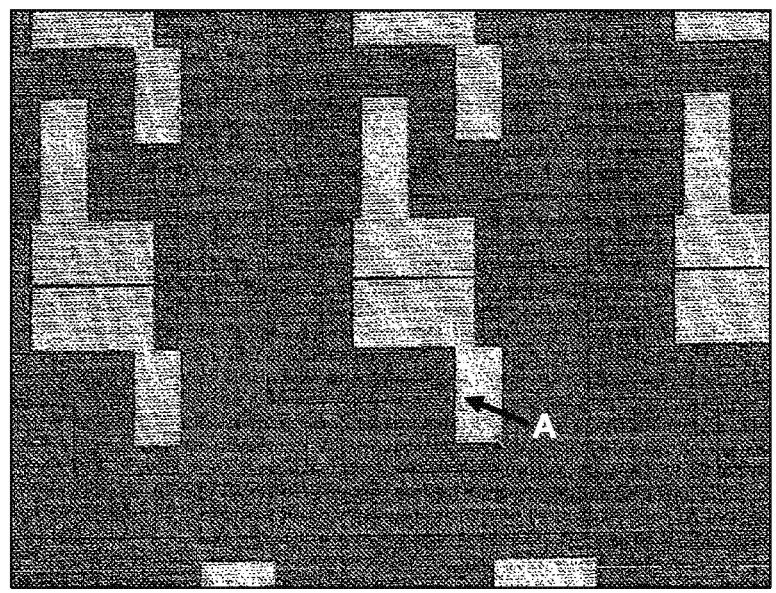
FIGS. 6a and 6b are images of self-aligned gate resist structures produced using methods embodying the invention.
Figure 6B:

Referring now to FIGS. 6a and 6b, in another method embodying the present invention, a FoG substrate was selected. Ti/Au source-drain contacts were then patterned on to the substrate using a standard process (Photoresist pattern and lift-off). 50 nm of IGZO was then deposited on to the substrate. The AZ5214E self-alignment process was then carried out as follows.
1 Dehydration bake (120° C. for 2 minutes)
2 Resist coat (4000 rpm for 30 seconds)
3 Soft bake (100° C. for 1 minute 20 seconds)
4 First exposure (7 seconds)
5 Image reversal bake (110° C. for 120 seconds)
6 Reverse exposure (32 seconds)
7 Develop (60 seconds AZ726)

The substrate was then examined to check that the required resist pattern had been formed.

Microscope images of the self-aligned gate pattern are shown in FIGS. 6a and 6b.

Thus, FIGS. 6a and 6b show images of the self-aligned gate resist structure produced in a method embodying the invention.

In FIG. 6a the difference between the unexposed resist and the fully cross linked resist. The two different rates of development for these resists resulted in a drop in resist thickness between these two areas (A). FIG. 6b shows a lift-off resist structure patterned around a 2 um gap in the source drain contacts. Due to over exposure of the photoresist the resist pattern was ~800 nm away from the edge of the source-drain contacts. A self-aligned gate structure was produced around a 2 um channel.

It will be appreciated that image reversal resist is resist that can be processed as either positive or negative photoresist. These materials are particularly suitable for lift-off techniques which require a negative wall profile. They are positive photoresists but can be used as a negative photoresist by performing an image reversal bake (typically above 110 deg C.) followed by a UV flood exposure. A crosslinking agent in the resist is activated by the image reversal bake but crucially only in exposed areas of the resist.

Referring now to FIG. 7, this illustrates steps in another method embodying the invention. FIG. 7a is a schematic cross section of the structure resulting from a first step of providing a substrate 1, first and second terminals 21, 22 supported by the substrate, the first and second terminals being separated by a gap 212, and the first and second terminals and the gap being located over a first region R of the substrate and within a perimeter of the first region. FIG. 7b is a schematic view of that structure from above. FIGS. 7c and 7d show a cross section and top view, respectively, of the structure subsequently resulting from steps of:
forming a covering 3 of photoresist material over at least the first region R of the substrate so as to cover the first and second terminals 21, 22, the gap 212, and any portion or portions of the first region of the substrate not located beneath the gap or the first and second terminals;
forming a mask 8 on a surface of the covering 3 of photoresist material, the mask 8 covering at least a portion of the gap extending from the first terminal to the second terminal, at least a portion of the first terminal 21 immediately adjacent said portion of the gap, and at least a portion of the second terminal 22 immediately adjacent said portion of the gap; and
exposing the resultant structure to electromagnetic radiation (indicated generally by the arrows in FIG. 7c) from above such that the mask shields a portion 323 of the photoresist covering under the mask from the electromagnetic radiation.

As can be seen, in the present example, the mask 8 covers only a portion of the gap and portions of the terminals 21, 22, but in alternative embodiments the extent of the mask may be different, for example covering all of the gap and/or all of one or both of the terminals.

Figure 7A:
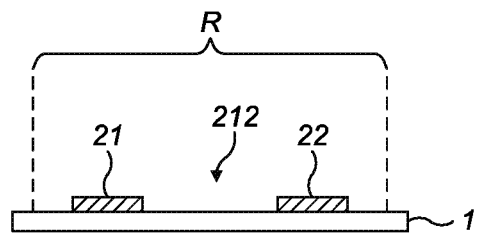
FIG. 7 illustrates steps in another method embodying the invention, for manufacturing a top gate transistor.
Figure 7B:
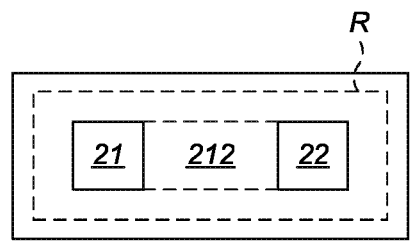
Figure 7C:
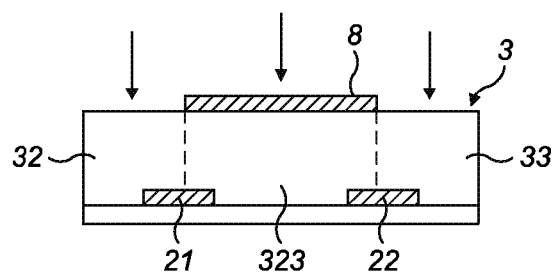
Figure 7D:
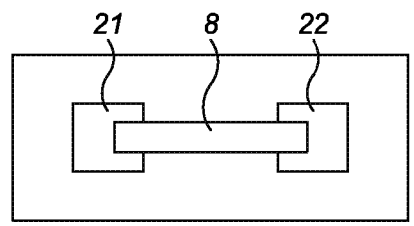
Figure 7E:
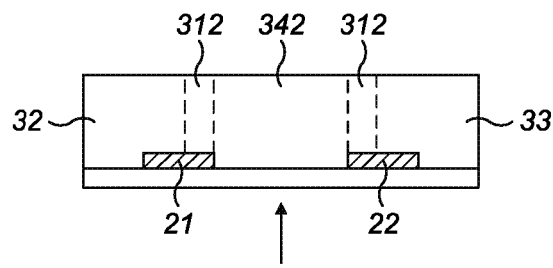

FIG. 7e shows the result of further steps, including:
removing the mask 8;
processing the resultant structure to reduce (i.e. selectively reduce) a solubility of the photoresist material 32, 33 exposed to electromagnetic radiation from above and render the exposed photoresist material 32, 33 substantially chemically insensitive to further exposure to electromagnetic radiation; and
exposing the resultant structure to electromagnetic radiation from below (the radiation being indicated generally by the arrow in FIG. 7e, such that the first and second terminals 21, 22 shield parts 312 of the previously unexposed portion 323 of photoresist covering from the electromagnetic radiation from below but another part 342 of the previously unexposed portion of photoresist covering is exposed (e.g. via the gap).

Figure 7F:
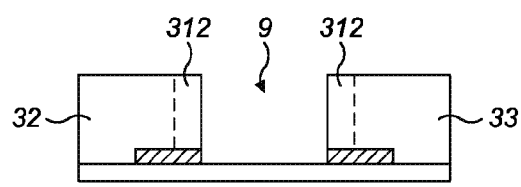
Figure 7G:
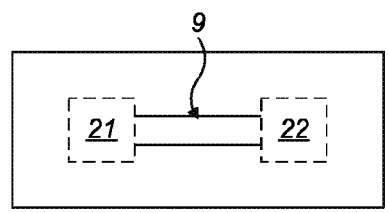

FIGS. 7f and 7g show the structure (cross section and top view respectively) resulting from a subsequent step of processing the photoresist material to remove photoresist material 342 that was shielded by the mask from the electromagnetic radiation from above but exposed to electromagnetic radiation from below, to form a window 9 in the covering of photoresist material. As can be seen, although the alignment of the mask 8 with respect to the terminals 21, 22 and gap may have been crude, the window 9 is very accurately aligned, extending in this example from an edge of the first terminal 21 to an edge of the second terminal.

Figure 7H:
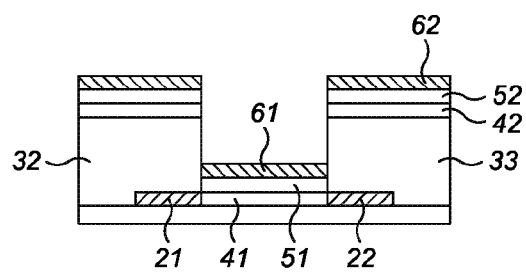

FIG. 7h illustrates the structure resulting from a further step of depositing a layer of semiconductor material 4; a layer of dielectric material 51; and a layer of conductor material 61 inside the window to form the device's semiconductor channel, gate dielectric, and gate terminal, respectively.

Figure 7I:
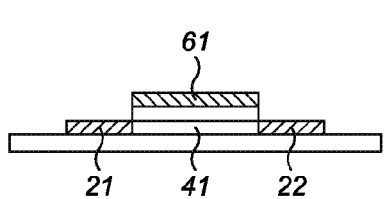
Figure 7J:
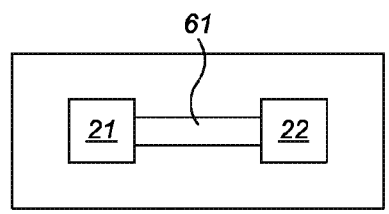

FIGS. 7i and 7j show the eventual device structure (cross section and top view) after a further step of removing remaining photoresist material 32, 33, which at the same time removes semiconductor 42, dielectric 52, and conductor 62 material that was deposited outside the window. In this example there is no overlap between the gate terminal either of the first and second terminals.

It will be appreciated that the method illustrated by FIG. 7 can generally be described as one involving image reversal patterning with backside exposure, as applied to the manufacture of a top gate device.

In another embodiment of the invention, closely related to the method of FIG. 7, before forming the covering of photoresist material, a layer of semiconductor material (extending at least across the gap, for example covering the region R) can be provided, together with a layer of dielectric material covering the semiconductor layer. Then, the covering of photoresist may be formed, and a mask may be formed on a surface of the photoresist, crudely aligned, again covering at least a portion of the gap extending from the first terminal to the second terminal, at least a portion of the first terminal 21 immediately adjacent said portion of the gap, and at least a portion of the second terminal 22 immediately adjacent said portion of the gap. Method steps as described above may then be used to form a window, accurately aligned with respect to the underlying terminals, inside which the gate is formed. Then, removal of remaining photoresist material exposes any portion of the dielectric and/or semiconductor layers not covered by the gate. If the extent of the semiconductor layer is such that it includes a portion (an uncontrollable portion, in that its conductivity cannot be controlled by the gate) which connects the first and second terminals but is not underneath the gate, then the gate terminal can be used as a mask to remove that uncontrollable portion. In other words, in certain embodiments, the accurately aligned gate terminal can be used as a mask to trim the semiconductor layer in particular.

An example of a method embodying the invention, in which semiconductor and dielectric layers are provided on the structure of substrate and source/drain terminals, is as follows.

In this example a top gate transistor was produced using a backside flood exposure. The substrate in this example was 25 um thick PEN laminated to a 0.7 mm glass substrate using ~25 um of adhesive. Other combinations of substrate material could be used providing the substrate is reasonably transparent to the curing wavelength of the image reversal photoresist. In this example AZ5214E photoresist was used (MicroChemicals—www.MicroChemicals.eu). Because of this the substrate needed to have some transparency between 310 nm-420 nm.

Source drain contacts were patterned onto the substrate by lift-off. However the contacts could be defined using other techniques (wet etching, plasma etching, ink jet printing, electron beam patterning). In this example the contact metal was deposited by thermal evaporation of Ti (5 nm) and Au (100 nm) thin films. Other materials can be used for the source-drain contacts providing they are sufficiently opaque to the curing wavelength of the image reversal photoresist. Examples include (but are not limited to) Cr, Mo, Cu, Al, Ag and Fe.

The semiconductor was deposited by pulsed DC sputtering and patterned using a wet-etch in 0.3M oxalic acid solution. In this example a 20 nm Indium Gallium Zinc Oxide (IGZO) film was used as the semiconductor. However other semiconductors could be used with this technique providing they have some transparency over the curing wavelengths of the image reversal photoresist.

A 50 nm Al2O3 dielectric was then deposited on to the substrate by atomic layer deposition and patterned by lift-off. However other dielectric materials could be used providing they have some transparency over the curing wavelengths of the photoresist. Examples include SiO2, MgO, SU8 and Teflon AF1601.

A dehydration bake was then carried out on the substrate (120° C. for 120 seconds). The photoresist used to produce the gate pattern (AZ5214E) was then spin-coated onto the substrate at 4000 rpm over a period of 30 seconds. This photoresist was then soft baked at 100° C. for 80 seconds on a hot plate. However an IR bake or oven bake could be used to perform the soft bake. The substrate was then exposed from the top side using a mask aligner (EVG 620). The mask used for the gate layer was significantly larger than the channel width of the transistors. In this example the gate width on the photo-mask was up to 48 um larger than the transistor channel length (removing the need for fine alignment). The exposure energy used was 47 mJ/cm$^2$ using a mercury bulb. The substrate was then baked at 110° C. for 120 seconds to cross link the exposed photoresist. The substrate was then exposed from the rear for 20 seconds (exposure energy 136 mJ/cm$^2$). This second exposure used the source-drain pattern as a photomask to define the channel. This exposure caused the photoresist to break down in the channel area. The exposed resist was then removed by soaking the substrate in developer (AZ726) for 60 seconds.

A 100 nm Molybdenum film was then sputtered onto the substrate by DC sputtering. However Al, Ti, and Au have also been deposited by thermal evaporation or sputtering to form the gate contact. The patterned photoresist layer was then soaked in acetone to leave the gate contacts on the substrate.

Variations to the methods described above will now be described.

In a first variant, to improve the profile of the patterned photoresist for lift-off a LOR resist layer (from Microchem—www.microchem.com) has been used under the patterning photoresist (AZ5214E). In this example an LOR layer was coated on the substrate prior to patterning the gate photoresist. The substrate was baked at 120° C. for 40 minutes prior to AZ5214E gate patterning. The gate patterning was then carried out using the process described above. An additional bake was carried out after gate photoresist patterning to cross link the patterning photoresist (100° C. for 3 minutes). The LOR layer was then etched away in AZ726 developer for 30 seconds to form an undercut suitable for lift-off. Following this the metal deposition and lift-off was carried out as normal.

In a second variant, to produce a completely self-aligned structure the deposited self-aligned gate can be used as an etch mask. This was achieved using the process described below, with reference to FIG. 8.

Figure 8A:
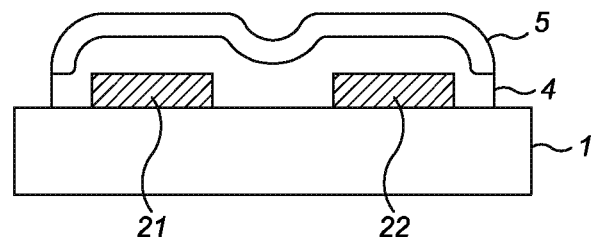
FIG. 8 illustrates steps in another method embodying the invention.
Figure 8B:
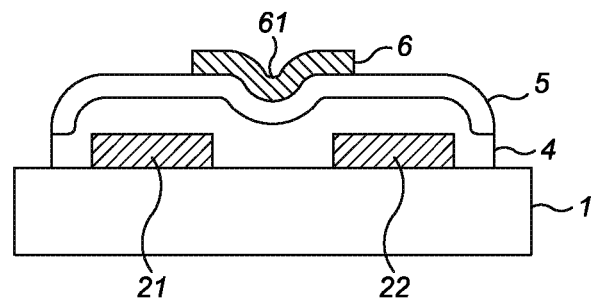
Figure 8C:
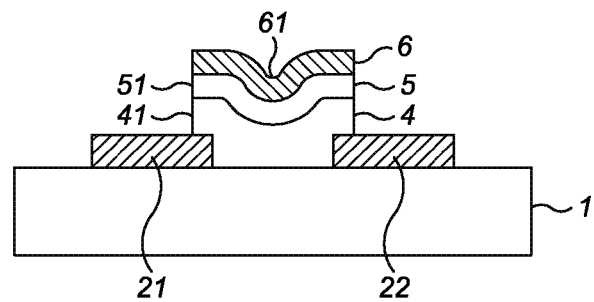

Firstly the source-drain layer (2) is formed using a process outlined above, creating electrodes 21 and 22 supported by transparent substrate 1 (as shown in FIG. 8a). The semiconductive layer 4 and dielectric layer 5 can then deposited using the processes outlined above, to yield the structure shown in FIG. 8a. The gate conductive layer 6 can then be deposited and patterned using the self-aligned image reversal process described above to yield the structure shown in FIG. 8b. The gate electrode 61 can then be used as an etch mask for semiconductive and dielectric layer patterning, to produce the top-gate thin-film transistor structure shown in FIG. 8c with dielectric region 51 and channel region 41. In principle any conductive layer could be used to form the gate contact. However careful consideration needs to be given to the selectivity of the etchant to the dielectric, semiconductor, source-drain contacts and gate contact. In this example a Molybdenum gate was used as a mask for Alumina dielectric and IGZO semiconductor etching. This was achieved by wet etching the alumina layer in AZ726 (TMAH based developer from Microchemicals).

With regard to the alumina etch, the substrate was immersed in a bath of AZ726 at 50° C. for 2.5 minutes (for a 50 nm Al2O3 film). To ensure an even etch rate the bath was stirred using a small magnetic stirrer at 600 rpm. The substrate was then rinsed in DI water and dried with a nitrogen gun.

Regarding the IGZO etch, to etch the IGZO layer the sample was immersed in an oxalic acid solution for 60 seconds (20 nm film) at room temperature (~20° C.). To ensure an even etch rate the bath was stirred using a small magnetic stirrer at 600 rpm. The substrate was then rinsed in DI water and dried with a nitrogen gun.

The above example used a wet-etch to pattern the dielectric and semiconductor layers. However plasma etching could also be used to etch the dielectric and gate layer. For example polymer based dielectrics such as SU8, Teflon, Cytop and Parylene can be etched using a $CF_4/O_2$ plasma. To reduce the number of process steps further the same etchant can be used to etch the dielectric and semiconductor layers. An example of this is using $BCl_3/O_2$ RIE etch to remove an Alumina dielectric and IGZO semiconductor.

In another variant (i.e. embodiment of the invention) the general processes described above can also be applied to produce a bottom gate structure (as shown in FIG. 9). To achieve this, a substrate 1 that is transparent within the crosslinking wavelength of the patterning photoresist is used. The gate pattern 61 is then produced by photolithography or other patterning technique (ink-jet printing, Nano Imprint Lithography (NIL) or laser ablation). Materials for the gate layer 6 include Au, Ag, Mo and Ti. However any material that is electrically conductive and optically opaque to chemically sensitive wavelengths of the photoresist can be used. The dielectric layer 5 (Alumina) is then deposited on to the substrate 1 by Atomic Layer Deposition (ALD). Other materials for dielectric deposition can include (but are not limited to) SiO2, Ta2O5, SU8, Teflon, Cytop and HfO2. Methods used to deposit these dielectrics include spin coating, ALD, sputtering and evaporation. However the dielectric chosen must be transparent to the chemically sensitive wavelength range of the photoresist.

Figure 9A:
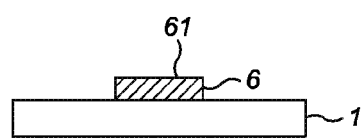
FIG. 9 illustrates steps in another method embodying the invention, for manufacturing a bottom gate transistor.
Figure 9B:
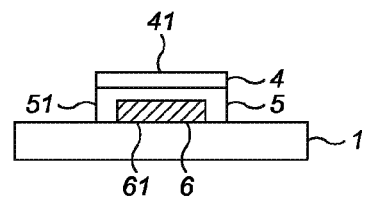
Figure 9C:
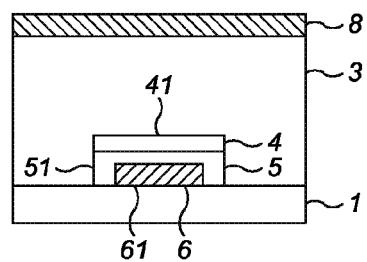
Figure 9D:
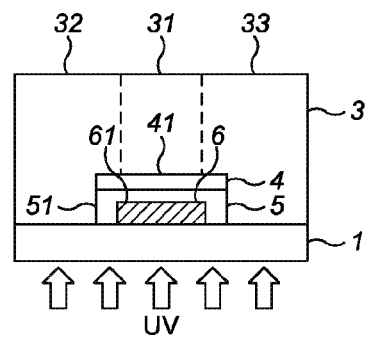
Figure 9E:
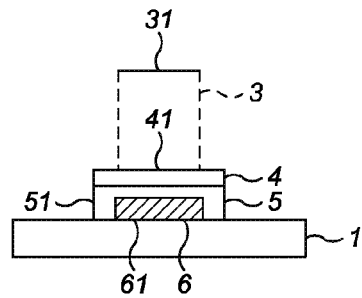
Figure 9F:
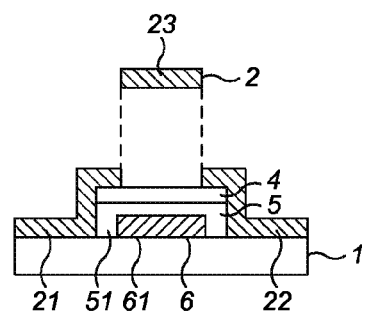
Figure 9G:
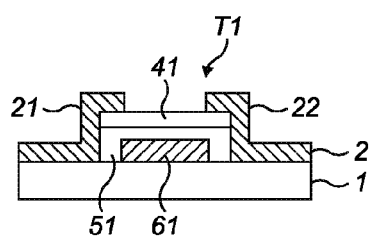

The semiconductive layer 4 is then deposited on to the substrate. Methods for this deposition include (but are not limited to) spin coating, sputtering, CVD and ALD. Example semiconductors include transparent metal oxide semiconductors (e.g. IGZO or ZTO) or organic semiconductors (e.g. Pentacene). The semiconductive layer 4 and dielectric layer 5 are then patterned, for example using photolithography and etching as described above. The source-drain contacts can then be patterned by depositing a photoresist 3 and first exposing the substrate though a photomask (see FIG. 9c) from above. When AZ5214E is used as the photoresist 3 an image reversal bake is used to cross-link any areas of the substrate that are exposed to UV energy. To prevent the source, drain and channel areas from exposure roughly aligned chrome areas on the photomask 8 are used to protect the photoresist. Following an image reversal bake the substrate is exposed from the rear (FIG. 9b). This causes the previously unexposed photoresist areas 32 and 33 to become soluble to developer solution. The substrate is then submerged in developer to remove only the photoresist exposed in the second UV exposure step (FIG. 9e). This leaves the photoresist 31 around the gate intact (FIG. 9e). A metal contact layer 2 can then be deposited on to the substrate 1 by evaporation, DC sputtering or other thin film deposition technique (FIG. 9f). The photoresist 3 can then be removed by lift-off using a suitable solvent (e.g. Acetone) to leave the source-drain contacts, respectively 21 and 22, remaining on the substrate (FIG. 9g). The resultant structure is a bottom-gate, top-contact thin-film transistor T1 consisting of gate 61, dielectric 51, channel 41, source 21 and drain 22.

It will be appreciated that FIG. 9 illustrates a method embodying the second aspect of the invention.

Figure 10A:
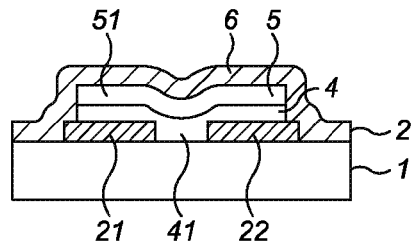
FIG. 10 illustrates steps in another method embodying the invention, for manufacturing a top gate transistor, and in which the gate material is substantially transparent.
Figure 10B:
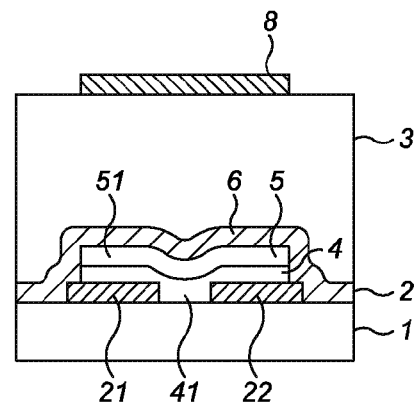
Figure 10C:
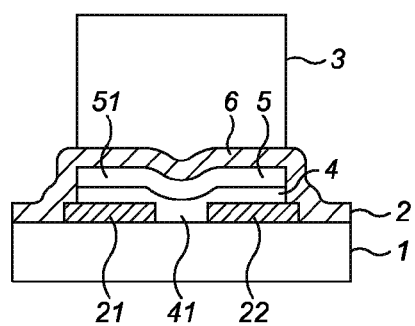
Figure 10D:
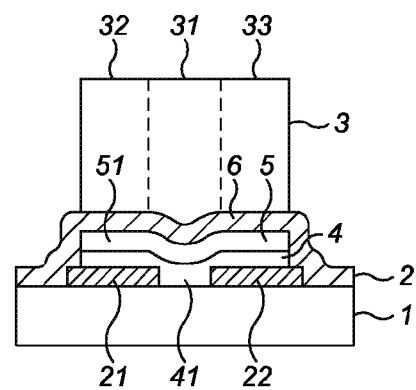
Figure 10E:
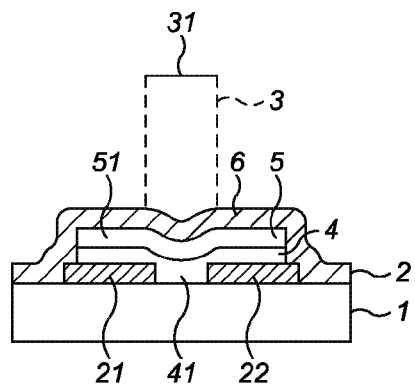
Figure 10F:
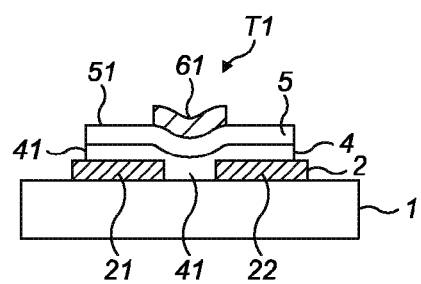

Another embodiment will now be described with reference to FIG. 10. In this variant the source-drain, semiconductor and dielectric are produced using a process generally as described/outlined above. A transparent gate material 6 (ITO—20 nm) is then deposited onto substrate 1 by sputtering (FIG. 10a). However other transparent conducting oxides (IZO, ZnO or IGZO) can be used. The substrate 1 is then coated with image reversal photoresist (AZ5214E) by spin coating at 4000 rpm for 30 seconds. A soft bake is then carried out at 100° C. for 80 seconds. The photoresist 3 is then exposed (47.6 mJ/cm$^2$) through a photo-mask 8 (FIG. 10b). This makes the photoresist outside the general gate area soluble. This exposed photoresist is then developed in a bath of TMAH based developer for 50 seconds (AZ726), as shown in FIG. 10c. The substrate is then washed in DI water for 20 seconds and blown dry with a nitrogen gun. A second exposure is then carried out using the rear of the source-drain contacts, respectively 21 and 22, as a photomask (140 mJ/cm$^2$). The photoresist 3 is then image reversal baked (110° C. for 2 minutes on a hotplate) to crosslink the exposed photoresist. A flood exposure is then carried out on the top side of the substrate (100 mJ/cm$^2$) to make the remaining unexposed photoresist 32 and 33 soluble (FIG. 10d). The substrate 1 is again developed in bath of an alkali based developer (AZ726) for 50 seconds. This leaves a patterned photoresist shape suitable for forming the gate contact 61 by etching (FIG. 10e). Etch processes that can be used to pattern the gate material include (but are not limited to) laser ablation, wet etching and plasma etching. The photoresist 3 can then be removed using acetone or other photoresist stripper (e.g. Microstrip). The final structure shown in FIG. 10f is a thin-film transistor T1, consisting of source 21, drain 22, semiconductive channel 41, gate region 51 and top-gate 61.

It will be appreciated that FIG. 10 illustrates a method embodying the third aspect of the invention.

In another embodiment, of the fourth aspect of the invention, the gate, semiconductor and dielectric are provided, for example by a process generally as described above. A transparent conductive material (ITO—20 nm) is then deposited by sputtering. However other transparent conducting oxides (IZO, ZnO or IGZO) can be used. The substrate is then coated with image reversal photoresist (AZ5214E) by spin coating at 4000 rpm for 30 seconds. A soft bake is then carried out at 100° C. for 80 seconds. The photoresist is then exposed (47.6 mJ/cm$^2$) through a photo-mask. This makes the photoresist outside the general source-drain area soluble. This exposed photoresist is then developed in a bath of TMAH based developer for 50 seconds (AZ726). The substrate is then washed in DI water for 20 seconds and blown dry with a nitrogen gun. A second exposure is then carried out using the rear of the gate contact as a photo-mask (140 mJ/cm$^2$). The photoresist is then image reversal baked (110° C. for 2 minutes on a hotplate) to crosslink the exposed photoresist. A flood exposure is then carried out on the top side of the substrate (100 mJ/cm$^2$) to make the remaining unexposed photoresist soluble. The substrate is again developed in bath of an alkali based developer (AZ726) for 50 seconds. This leaves a patterned photoresist shape suitable for forming the source-drain contacts by etching. Etch processes that can be used to pattern the gate material include (but are not limited to) laser ablation, wet etching and plasma etching. The photoresist can then be removed using acetone or other photoresist stripper (e.g. Microstrip).

A general method embodying the fourth aspect of the invention is illustrated by FIG. 16. The method includes providing a substrate 1, gate terminal 61, layer of semiconductor material 4, and a layer of dielectric material 5 separating the gate terminal from the layer of semiconductor material, the gate terminal being supported by the substrate. The layer of semiconductor material 4 comprises a channel portion 400, arranged over the gate terminal, a first end portion 401, extending from a first end of the channel portion beyond an edge of the gate terminal, and a second end portion 402, extending from a second end of the channel portion beyond an edge of the gate terminal, the channel portion 400 providing the device's semiconductor channel and the layer of dielectric material providing the gate dielectric, and the gate terminal and the layer of semiconductor material being located over a first region R of the substrate and within a perimeter of the first region.

The method further comprises:
forming a layer of conductor material 600 over the first region of the substrate to cover the gate terminal, layer of dielectric material, and the layer of semiconductor material;
forming a covering 3 (e.g. a layer or plurality of layers) of photoresist material covering the layer of conductor material 600;
forming a mask 8 on a surface of the covering of photoresist material, the mask covering the channel portion 400, at least part of the first end portion 401, and at least part of the second end portion 402;
exposing the resultant structure to electromagnetic radiation from above such that the mask 8 shields a portion 302 of the photoresist covering under the mask from said electromagnetic radiation;
processing the resultant structure to remove the photoresist material 301 exposed to said electromagnetic radiation from above and expose (i.e. uncover) conductor material 600 not located under said mask;
exposing the structure to electromagnetic radiation, to which the conductor material is substantially transparent, from below, such that the gate terminal 61 shields a part 304 of the previously unexposed portion of photoresist covering from the electromagnetic radiation from below but other parts 303 of the previously unexposed portion of photoresist covering are exposed;
processing the structure to reduce a solubility of the photoresist material 303 shielded from said electromagnetic radiation from above but exposed to said electromagnetic radiation from below;
exposing the structure to electromagnetic radiation from above so as to increase a solubility of the previously unexposed photoresist material 304;
processing the photoresist material to remove photoresist material 304 that was shielded by the mask from the electromagnetic radiation from above, shielded by the gate terminal from the electromagnetic radiation from below, and then exposed to electromagnetic radiation from above, so as to form a window 9 in the layer of photoresist material exposing (i.e. uncovering) the surface of a portion of the layer of conductor material over the gate terminal; and
removing exposed conductor material (the remaining conductor material 600 still covered by photoresist material providing the first and second terminals),
the method further comprising removing the mask 8 before the second step of exposing from above.

Figure 15:
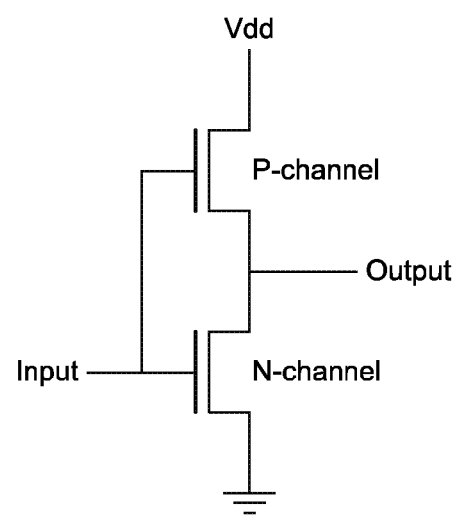
FIG. 15 illustrates apparatus manufactured by a method embodying the invention.
Figure 16A:
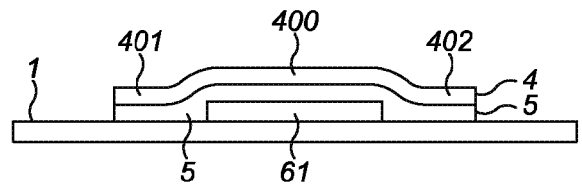
FIG. 16 illustrates steps in another embodiment of the invention.
Figure 16B:
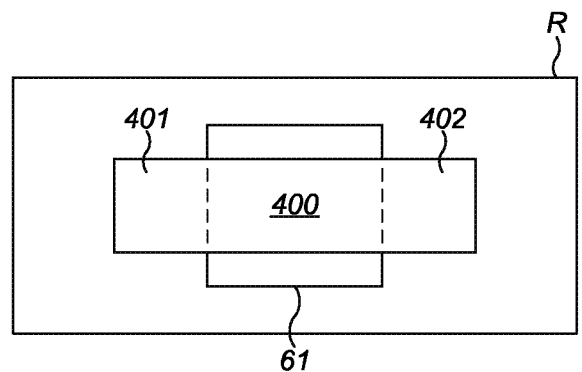
Figure 16C:
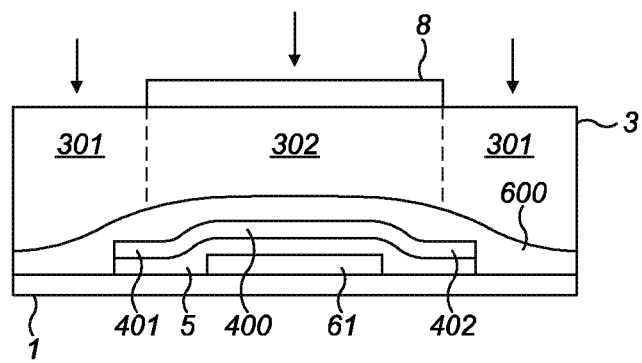
Figure 16D:
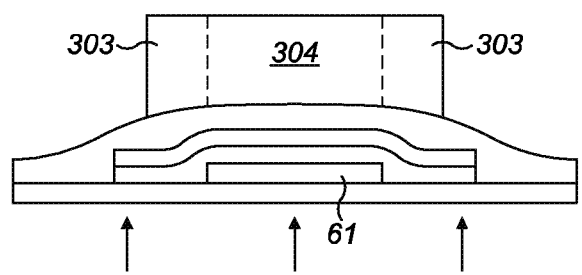
Figure 16E:
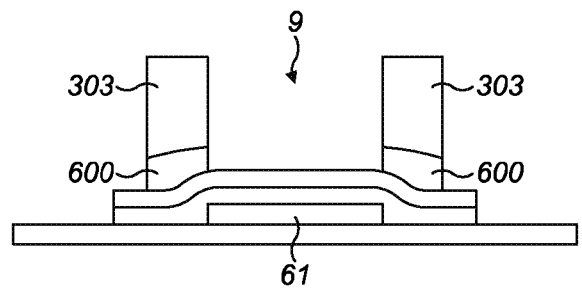

Methods embodying the invention may also be applied to produce a CMOS device, such as an inverter. This requires the separate patterning of n- and p-type semiconductor materials. Embodiments of the invention can be applied in several ways to produce a CMOS device such as an inverter as shown in FIG. 15. A CMOS inverter has complementary transistors (n- and p-channel) which share a common input (gate) and have a common output.

Figure 11I:
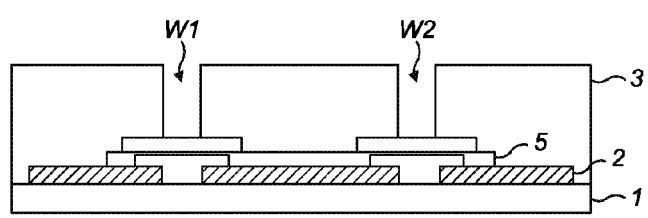
FIG. 11 illustrates steps in another method embodying the invention, for manufacturing electronic apparatus comprising complementary transistors.
Figure 11J:
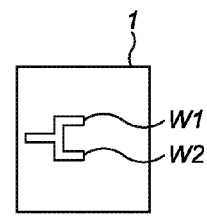
Figure 11K:
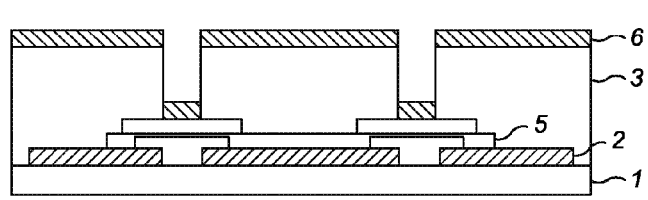
Figure 11L:
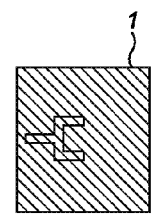
Figure 11M:
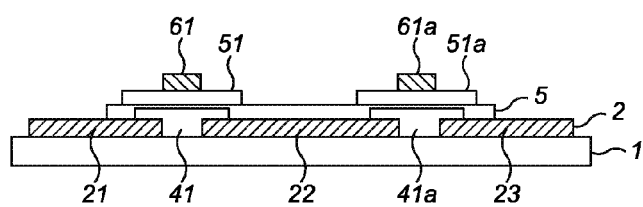
Figure 11N:
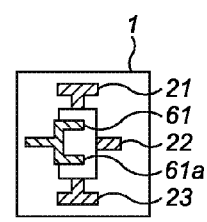

In one embodiment a transparent substrate 1 is supporting conductive regions 21, 22 and 23 as depicted in FIG. 11a (side-view) and FIG. 11b (top-view). In FIG. 11c a layer of n-channel material 41 has been deposited over the region between electrodes 21 and 22, and a layer of p-channel material 41a over the region between electrodes 22 and 23. A top-view of this configuration is shown in FIG. 11d. In FIG. 11e a layer of transparent dielectric material 5 has been deposited over the substrate 1 and patterned such that the dielectric completely covers both semiconductive regions 41 and 41a (FIG. 11f shows a top-view). In FIG. 11g a photoresist 3 has been deposited over the substrate 1 and a photomask 8 aligned such that both semiconductive regions 41 and 41a are beneath the chrome of the photomask. The substrate has then been treated with UV from above with photomask 8 still covering part of the substrate. Again FIG. 11h shows a top-view of the substrate (without photomask). FIG. 11i shows a further stage after image reversal bake, exposure from the reverse side and development of photoresist 3. The opaque electrode regions 21, 22 and 23 have prevented UV from exposing regions of photoresist 3 which were previously beneath photomask 8. Windows W1 and W2 (shown in top-view FIG. 11j) have formed above the semiconductive channel regions 41 and 41a. After deposition of conductive layer 6 (FIG. 11k/FIG. 11l) and lift-off (FIG. 11m/FIG. 11n) the structure is completed. The complementary transistors consist of power rail 21, n-channel 41 (with dielectric 51 and gate 61), p-channel 41a (with dielectric 51a and gate 61a), output 22 and ground-rail 23. Gate regions 61 and 61a are connected and form the device input.

Figure 12A:
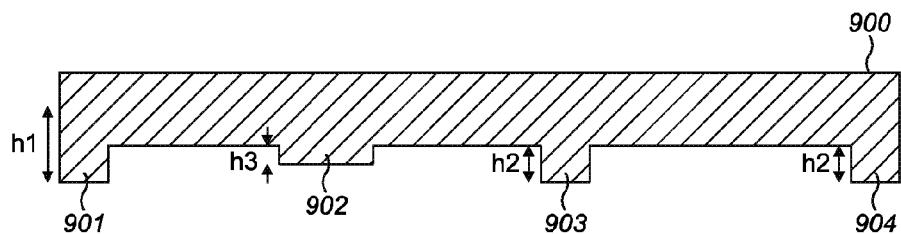
FIG. 12 illustrates steps in another method embodying the invention.
Figure 12B:
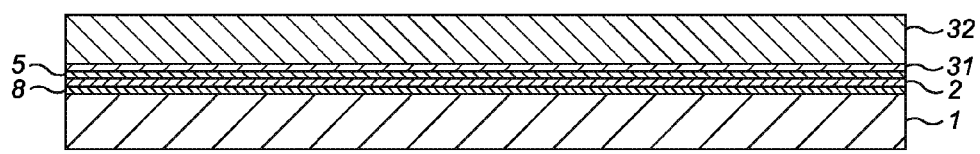
Figure 12C:
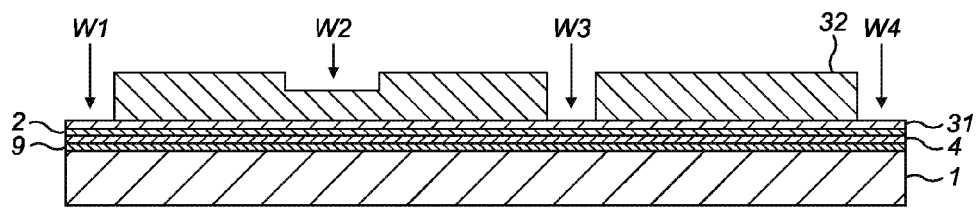
Figure 12D:
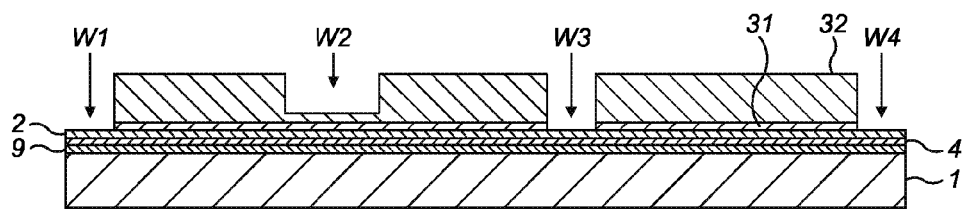
Figure 12E:
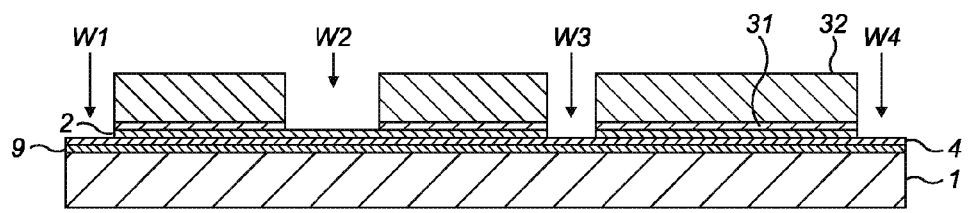
Figure 12F:
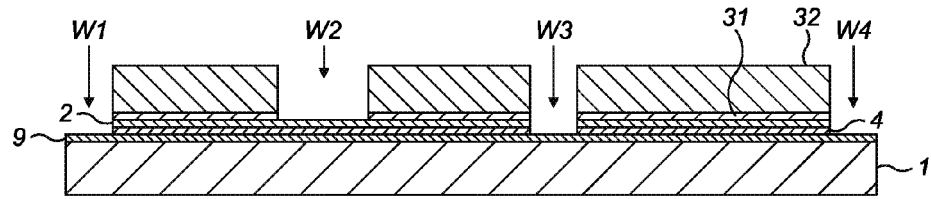
Figure 12G:
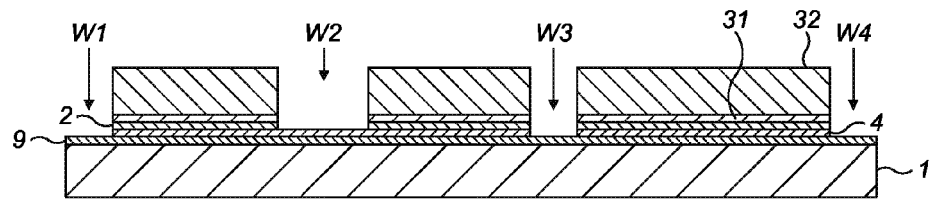
Figure 12H:
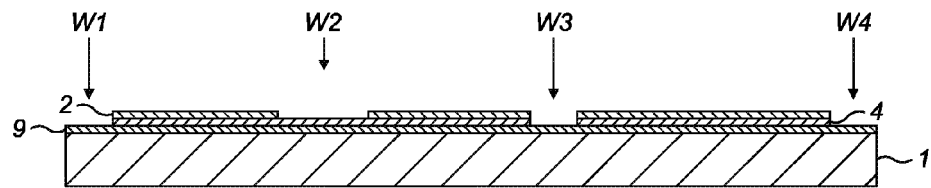
Figure 12I:
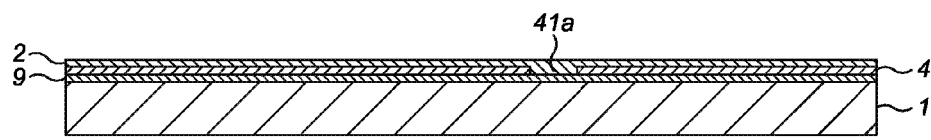
Figure 12J:
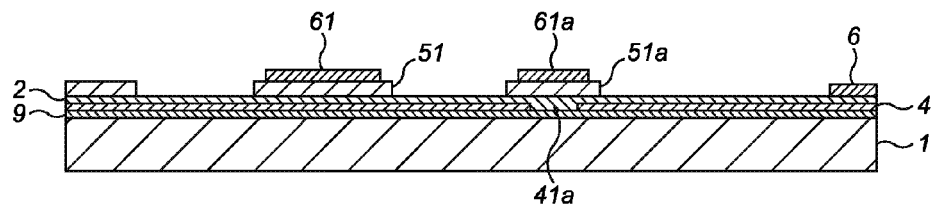

In a further embodiment a transparent substrate 1 is provided with a layer of insulative material 8, n-type semiconductive material 2 and conductive material 5. The substrate 1 has been coated with lift-off resist layer 31 and UV imprint resist 32, as shown in FIG. 12b. FIG. 12a shows a multi-height imprint stamp 900 consisting of regions 901, 902, 903 and 904, respectively corresponding to heights h2, h3, h2 and h2. FIG. 12c shows a stage after which tool 900 has been urged into the resist materials 31 and 32, replicating the features of imprint stamp 900, creating windows W1, W2, W3 and W4 corresponding to features 901, 902, 903 and 904, respectively. In FIG. 12 a further stage is depicted, after the exposed lift-off resist 31 in W1, W3 and W4 has been removed by etching in the same process reducing the height of UV imprint resist 32 in W2. FIG. 12e shows a further stage where the exposed conductive layer 2 in W1, W3 and W4 has been removed by etching, in the same process removing both the exposed UV imprint resist 32 and lift-off resist 31 in W2, so as to expose the top-surface of the conductive layer 2 within window W2. FIG. 12f shows a further stage where the exposed semiconductive layer 4 has been removed from W1, W3 and W4, in a process which has not affected the exposed conductive layer in W2. FIG. 12g shows a further stage where the exposed conductive layer in W2 is removed by etching. During this process the exposed insulative layer 9 in W1, W3 and W4 is largely unaffected by the etch process. FIG. 12h shows a further stage after the remaining resists 31 and 32 have been removed by solvent process. FIG. 12i shows a further stage in which a layer of p-type semiconductive material 41a has been deposited in the area W3, where the n-type semiconductive layer 41 has been disrupted. FIG. 12j shows a final stage. A layer of dielectric material 5 has been provided and patterned, for example by using the patterned conductive layer 2 as a photomask and exposing a photoresist from beneath the substrate. A layer of conductive material 6 has also been patterned by a method embodying the invention. These provide dielectric regions 51 and 51a, and gate regions 61 and 61a. The gate regions are connected such that they form a common input to the device.

Consideration of appropriate conductive materials for the n-channel and p-channel materials is important. Gold is a suitable injection layer for both types of device. However, it may be appropriate that conductive layer 2 consists of more than one material, such that the lower material provides good injection to the n-channel layer and the upper material provides good injection to the p-channel device. A further variant provides a patterned layer of dielectric material in window W3 to prevent any contact of n-channel and p-channel layers at this point.

Embodiments of the invention may also be applied to provide connections between different layers of the device, for example between the gate level and the source-drain level. This can be achieved by a number of methods, for example by modifying the design of the source-drain pattern, patterning of the dielectric layer and appropriate control of one or more photoresist exposure processes. In this example part of the source-drain layer has been patterned such that windows have been formed. When the image reversal resist process is used the spacing of the windows is such that the photoresist patterns formed enable contact of the subsequent conductive layer (gate) to the source-drain layer immediately surrounding the windows and a continuous conductive pathway is formed.

Figure 13A:
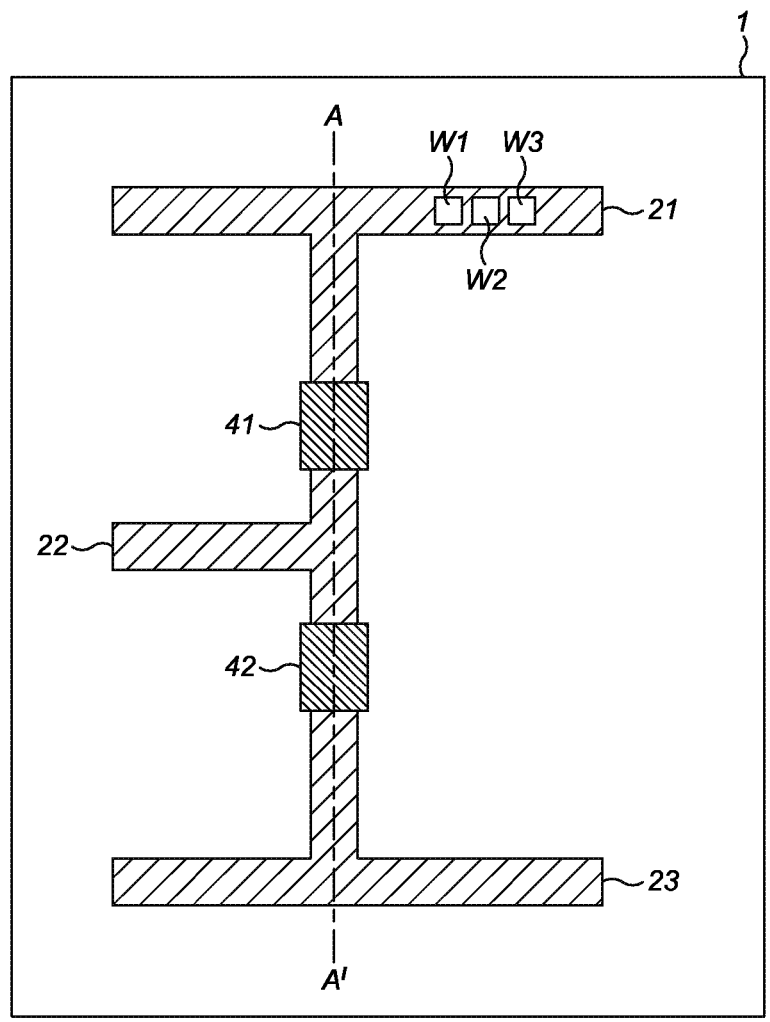
FIG. 13 illustrates steps in another method embodying the invention.
Figure 13B:
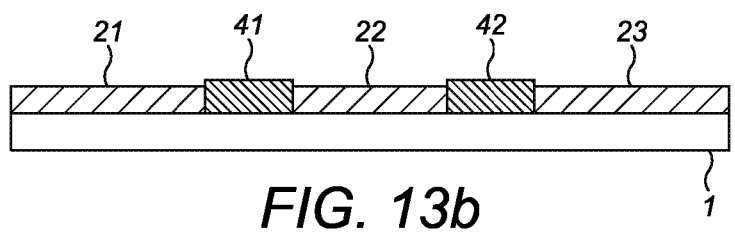
Figure 13C:
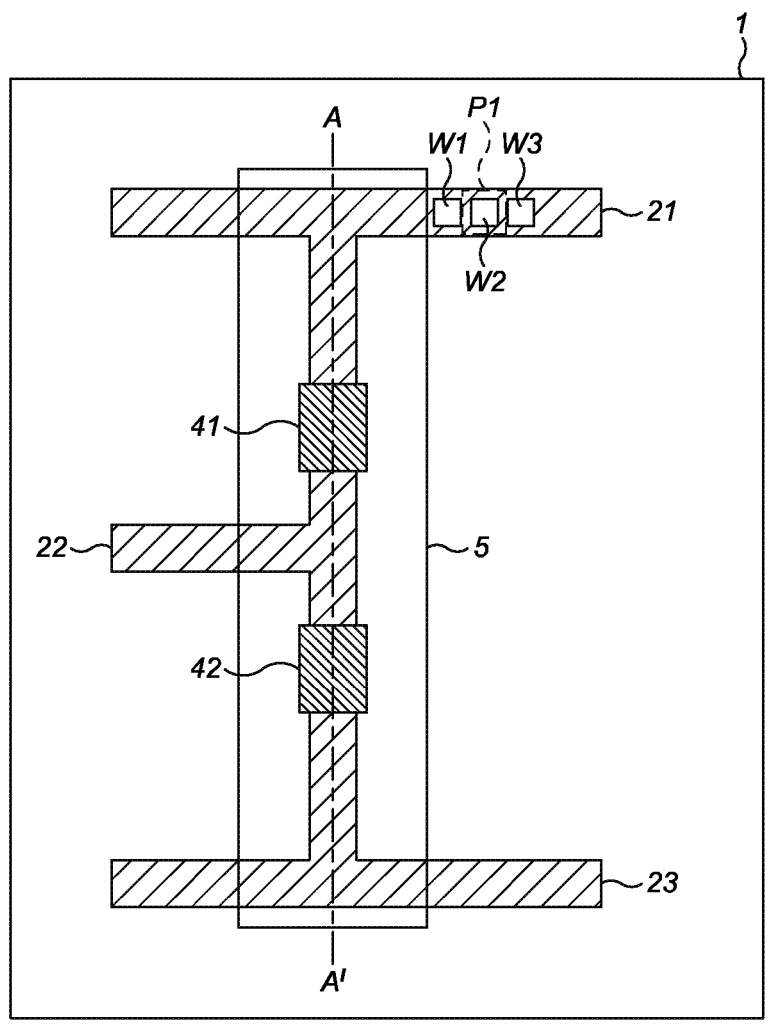
Figure 13D:
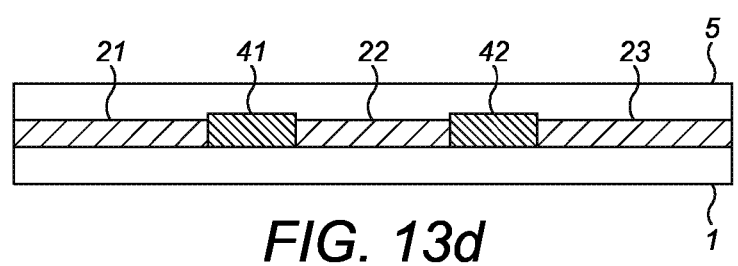
Figure 13E:
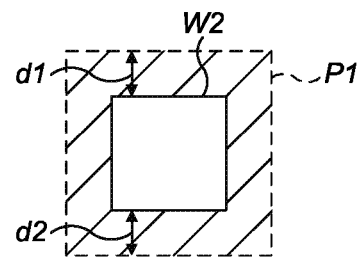
Figure 13F:
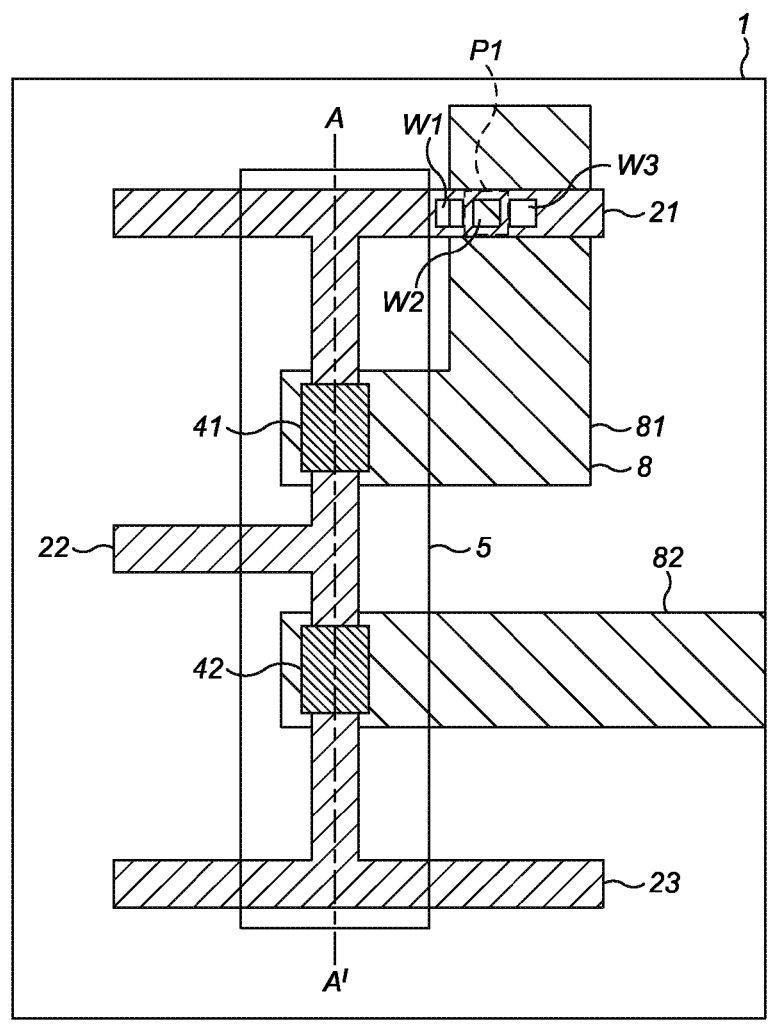

Referring now to FIG. 13a this shows a transparent substrate 1 supporting a layer of conductive material 2, which has been patterned in regions 21, 22 and 23. Semiconductive layer 4 has been deposited and patterned into regions 41, connecting conductive regions 21 and 22, and region 42, connecting conductive regions 22 and 23. During the patterning process, for example imprinting or photolithography, windows W1, W2 and W3 have been created within conductive region 21. A side-view along axis A-A' is shown in FIG. 13b which includes the transparent substrate 1. FIG. 13c shows a further stage where a layer of dielectric material 5 has been deposited over part of the substrate 1 such that it covers both semiconductive regions 41 and 42, but only partly covers conductive regions 21, 22 and 23. Windows W1, W2 and W3 are not covered by dielectric layer 5. FIG. 13d shows the side-view. FIG. 13e shows a larger-scale picture of perimeter P1, which includes window W1. This shows the upper and lower distances d1 and d2 from the edge of W1 to the edge of conductive region 21. FIG. 13f shows a further stage where a layer of photoresist 3 has been deposited over the entire substrate 1 and then a photomask 8 arranged. Photomask 8 covers part of the substrate, including photomask region 81 which covers the semiconductive regions 41, part of window W1 and the entirety of windows W2 and W3, and photomask region 82 which covers semiconductive region 42.

Figure 13G:
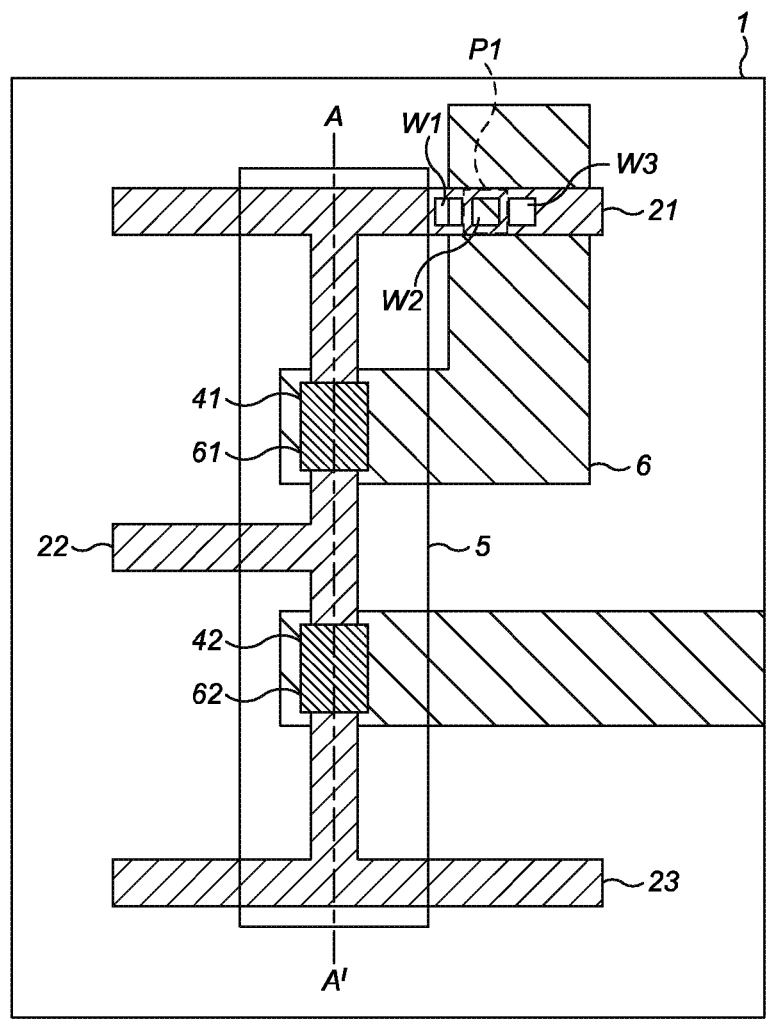
Figure 13H:
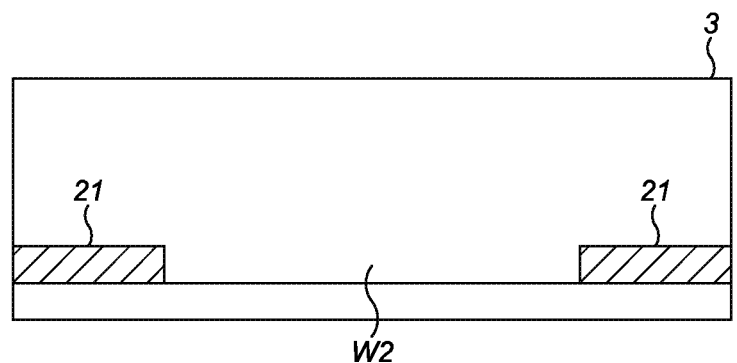
Figure 13I:
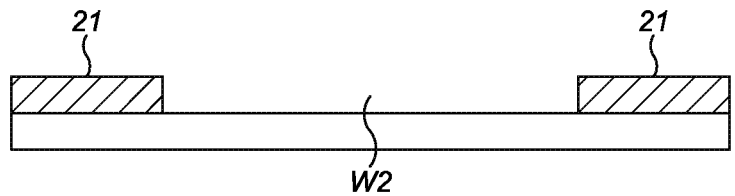
Figure 13J:
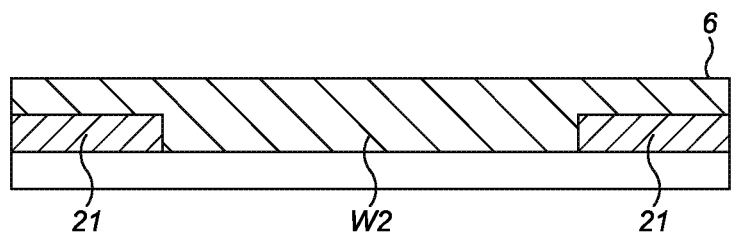

FIG. 13g shows a final stage after the image reversal process has been performed to pattern conductive layer 6. This has resulted in gate regions 61 and 62, respectively covering semiconductive channel regions 41 and 42. Conductive layer 6 has also formed over part of window W1 and entirely over windows W2 and W3. Distances d1 and d2 can be varied so as to change the aperture of windows W1, W2 and W3. Through control of the aperture the photoresist pattern around windows W1, W2 and W3 during the reverse exposure process (i.e. when conductive region 21 is used as an in situ photomask) can be varied. In this case the photoresist has been overexposed such that it is completely removed in the development stage. FIG. 13h shows a side-view of perimeter P1, which after reverse-exposure and development using the invention is completely clear of photoresist 3 (FIG. 13i). Conductive layer 6 is thus able to completely overlap both conductive region 21 surrounding windows W2 (FIG. 13j) and W3, and partly surrounding window W1, in addition to filling the windows W2 and W3, and part-filling window W1. The final structure in FIG. 13g is an nmos inverter, with power-rail 21, output 22, input 62 and ground-rail 23.

Figure 14A:
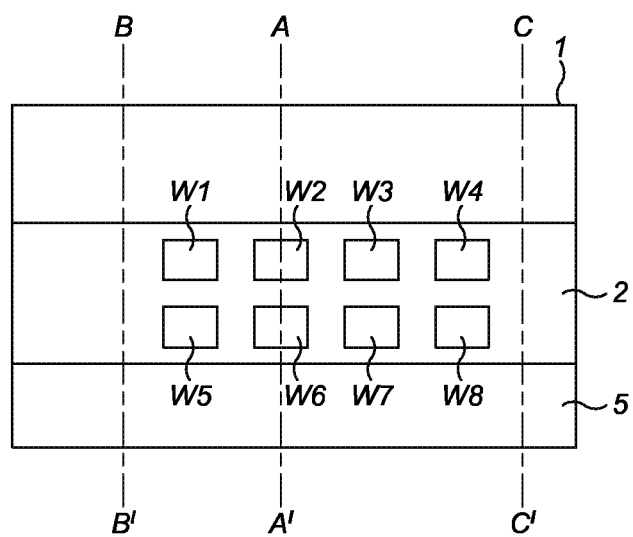
FIG. 14 illustrates steps in another method embodying the invention.
Figure 14B:
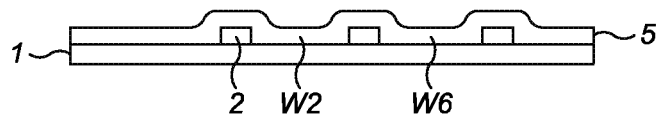
Figure 14C:
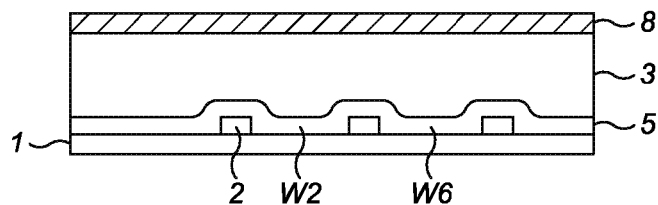
Figure 14D:
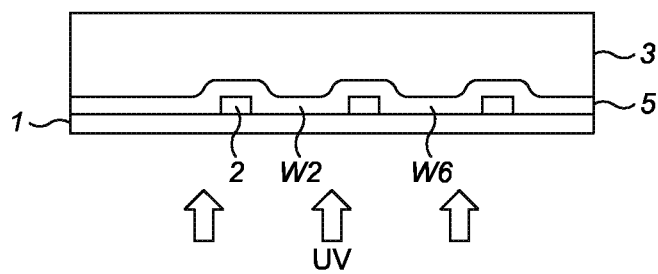
Figure 14E:
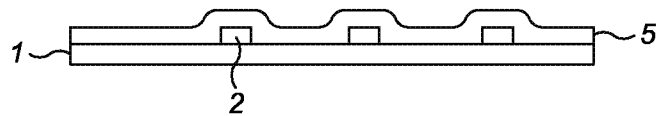
Figure 14E:
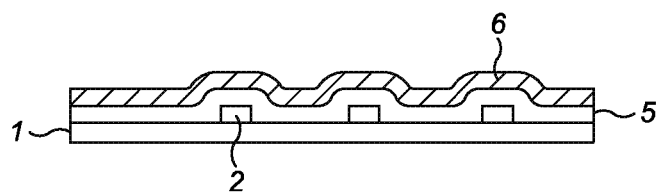
Figure 14G:
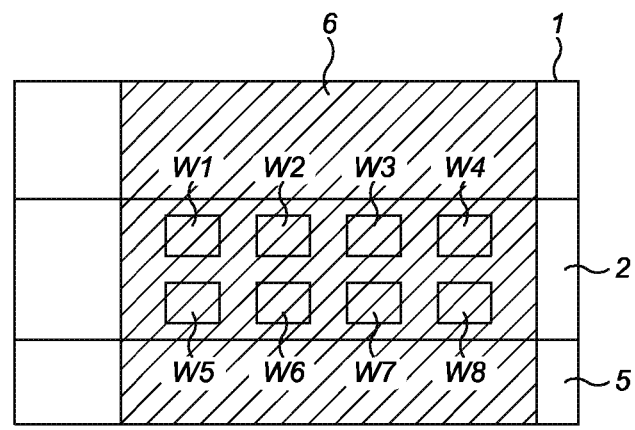

Referring now to FIG. 14a this shows a transparent substrate 1 supporting a conductive layer 2 containing windows W1 to W8. The substrate is completely covered within dielectric layer 5, although it will be appreciated that the substrate could form part of a larger substrate in which dielectric layer is not continuous. FIG. 14b shows a side-view of the substrate along axis A-A' including windows W2 and W6. In FIG. 14c a layer of photoresist 3 has been deposited over the substrate 1 and a photomask 8 provided, covering the region within axes B-B' and C-C' (as shown in FIG. 14a). The substrate is irradiated from above such that the area beneath the photomask 8 is protected from the radiation. FIG. 14d shows a further stage after image reversal bake whereby the substrate is irradiated from beneath, with the conductive layer 2 acting as a photomask. FIG. 14e shows a further stage in which the photoresist 3 has been developed. All of the photoresist 3 covering the region within axes B-B' and C-C' has been removed. Windows W1-W8 are arranged such that they increase the exposure of the photoresist 3 during the reverse exposure process in FIG. 14b. A further stage is shown in FIG. 14f whereby a layer of conductive material 6 has been deposited over the substrate. After lift-off of the photoresist 3 (which has remained where the photoresist was originally exposed, i.e. the regions where photomask 8 was not protecting the photoresist 3), the conductive layer is patterned as depicted in FIG. 14g. In this way a crossover of conductive layers 2 and 6 has been formed, separated by dielectric layer 5.

Figure 17A:
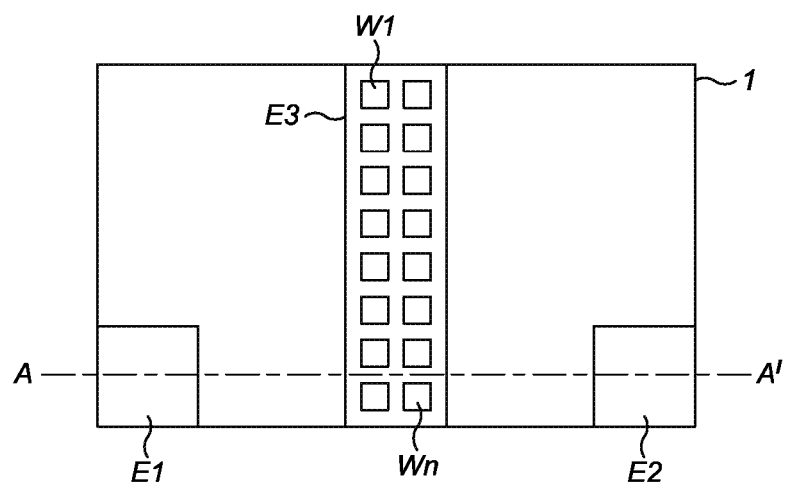
FIG. 17 illustrates steps in another method embodying the invention.
Figure 17B:
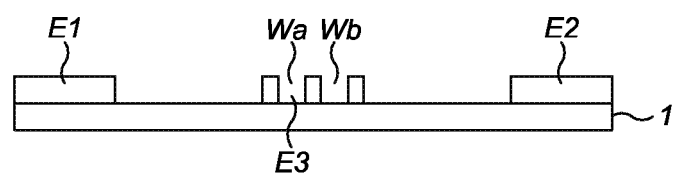
Figure 17C:
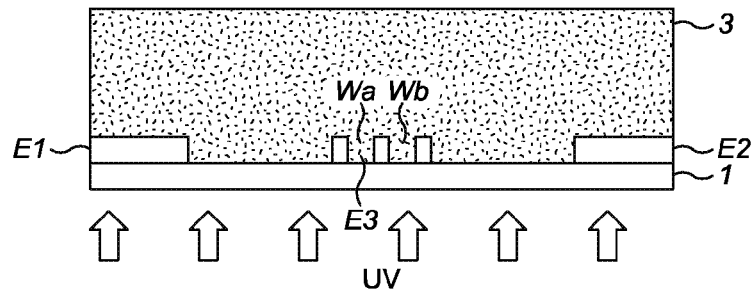
Figure 17D:
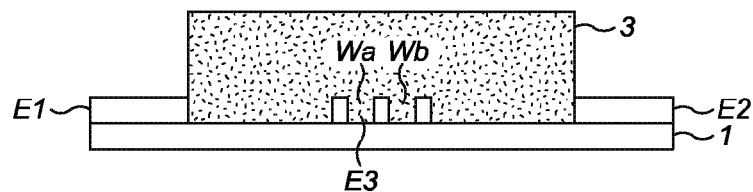
Figure 17E:
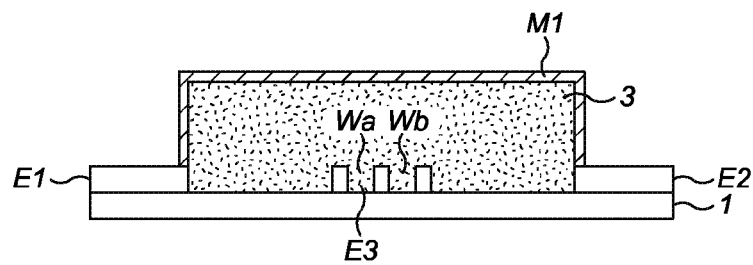
Figure 17F:
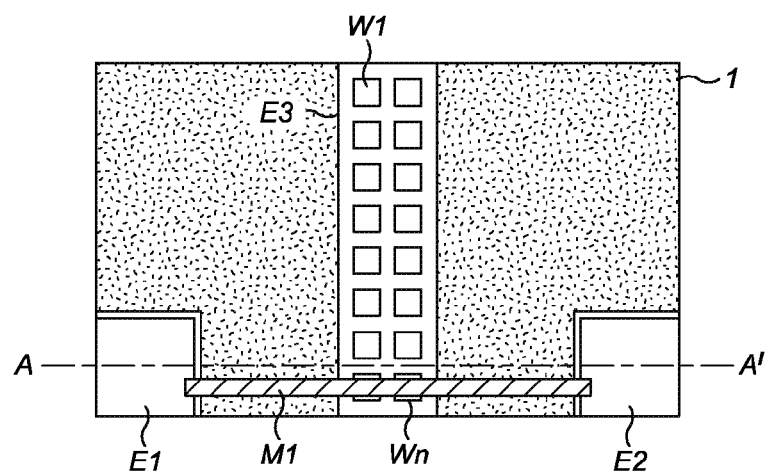

Referring now to FIG. 17a this shows a top-view of a transparent substrate 1 with electrodes E1, E2 and E3. Electrode E3 is patterned with transparent windows W1, Wn (the windows may be devoid of conductive material or could be areas of transparent conductive material formed in a method embodying the invention). FIG. 17b shows a side-view of the configuration along axis A-A' with windows Wa and Wb separating regions of electrode E3. In FIG. 17c, a layer of UV-curable resist material 3 has been deposited over the substrate. This is then exposed to UV radiation from beneath the substrate. FIG. 17d shows a further stage after development of UV-curable resist 3. Electrodes E1 and E2 are substantially clear of resist 3, since they are opaque to the UV radiation and prevent full-curing of the UV-curable resist 3. Windows Wa and Wb within electrode E3 are spaced such that UV-curable resist 3 has been fully cured over electrode E3. In FIG. 17e a conductive layer M1 has been deposited, for example by jet-printing. This provides a connection from electrode E1 to E2, but is separated from electrode E3 by UV-curable resist 3. FIG. 17f shows a top-view of the substrate after processing. This method could be used to connect different logic gates (NOT, NAND, NOR) or to enable configurable/programmable logic, e.g. by printing.

It will be appreciated that methods embodying the invention may be used to manufacture a range of electronic devices, including, but not limited to, transistors.

The invention claimed is:

1. A method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:
   a) providing at least a substrate and said first and second terminals supported, either directly or indirectly, by the substrate, the first and second terminals being separated by a gap, and the first and second terminals and the gap being located over a first region of the substrate and within a perimeter of the first region;
   b) forming a covering of photoresist material over at least the first region of the substrate so as to cover the first and second terminals, the gap, and any portion or portions of the first region of the substrate not located beneath the gap or the first and second terminals;
   c) forming a mask on a surface of the covering of photoresist material, the mask covering at least a portion of the gap extending from the first terminal to the second terminal, at least a portion of the first terminal immediately adjacent said portion of the gap, and at least a portion of the second terminal immediately adjacent said portion of the gap;
   d) exposing the structure resulting from step (c) to electromagnetic radiation from above such that the mask shields a portion of the photoresist covering under the mask from said electromagnetic radiation;
   e) processing the structure resulting from step (d) to reduce a solubility of the photoresist material exposed to said electromagnetic radiation from above;
   f) exposing the structure resulting from step (e) to electromagnetic radiation from below, such that the first and second terminals shield parts of the previously unexposed portion of photoresist covering from the electromagnetic radiation from below but another part of the previously unexposed portion of photoresist covering is exposed;
   g) processing the photoresist material to remove photoresist material that was shielded by the mask from the electromagnetic radiation from above but exposed to electromagnetic radiation from below, to form a window in the covering of photoresist material; and
   h) depositing at least one of: a layer of semiconductor material; a layer of dielectric material; and a layer of conductor material, at least inside said window, to form at least one of: the semiconductor channel, gate dielectric, and gate terminal, respectively;

wherein step (a) comprises providing said substrate, a layer of semiconductor material supported by the substrate, and said first and second terminals supported directly by the layer of semiconductor material;

wherein step (h) comprises depositing a layer of dielectric material and a layer of conductor material, at least inside said window, to form the gate dielectric and the gate terminal.

2. A method in accordance with claim 1, further comprising removing said mask before step (g).

3. A method in accordance with claim 2, wherein step (d) comprises a sub-step of removing said mask after exposing the structure resulting from step (c).

4. A method in accordance with claim 1, further comprising removing remaining material of the photoresist covering after step (h).

5. A method in accordance with claim 1, wherein step (a) comprises providing said substrate, a layer of semiconductor material supported by the substrate, said first and second terminals supported directly by the layer of semiconductor material, and a layer of dielectric material covering at least the semiconductor material under said gap.

6. A method in accordance with claim 5, wherein step (h) comprises depositing a layer of conductor material, at least inside said window, to form the gate terminal.

7. A method in accordance with claim 1, wherein step (a) comprises providing said substrate, said first and second terminals supported directly by the substrate, a layer of semiconductor material covering at least said gap, and a layer of dielectric material covering at least the semiconductor material covering said gap.

8. A method in accordance with claim 7, wherein step (h) comprises depositing a layer of conductor material, at least inside said window, to form the gate terminal.

9. A method in accordance with claim 1, wherein said covering of photoresist material comprises a plurality of layers of photoresist material.

10. A method in accordance with claim 9, wherein said covering of photoresist material comprises a first layer of a first photoresist material, and a second layer of a second, different photoresist material.

11. A method in accordance with claim 10, wherein said first photoresist material is a lift-off resist material.

12. A method in accordance claim 10, further comprising forming an undercut in the first layer of photoresist material inside said window before step (h).

13. A method in accordance with claim 1, wherein said processing to reduce a solubility comprises baking.

14. A method in accordance with claim 1, wherein said photoresist material is an image-reversal photoresist material.

15. A method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:
   a) providing at least a substrate and said first and second terminals supported, either directly or indirectly, by the substrate, the first and second terminals being separated by a gap, and the first and second terminals and the gap being located over a first region of the substrate and within a perimeter of the first region;

b) forming a covering of photoresist material over at least the first region of the substrate so as to cover the first and second terminals, the gap, and any portion or portions of the first region of the substrate not located beneath the gap or the first and second terminals;

c) forming a mask on a surface of the covering of photoresist material, the mask covering at least a portion of the gap extending from the first terminal to the second terminal, at least a portion of the first terminal immediately adjacent said portion of the gap, and at least a portion of the second terminal immediately adjacent said portion of the gap;

d) exposing the structure resulting from step (c) to electromagnetic radiation from above such that the mask shields a portion of the photoresist covering under the mask from said electromagnetic radiation;

e) processing the structure resulting from step (d) to reduce a solubility of the photoresist material exposed to said electromagnetic radiation from above;

f) exposing the structure resulting from step (e) to electromagnetic radiation from below, such that the first and second terminals shield parts of the previously unexposed portion of photoresist covering from the electromagnetic radiation from below but another part of the previously unexposed portion of photoresist covering is exposed;

g) processing the photoresist material to remove photoresist material that was shielded by the mask from the electromagnetic radiation from above but exposed to electromagnetic radiation from below, to form a window in the covering of photoresist material; and h) depositing at least one of: a layer of semiconductor material; a layer of dielectric material; and a layer of conductor material, at least inside said window, to form at least one of: the semiconductor channel, gate dielectric, and gate terminal, respectively;

wherein step (a) comprises providing said substrate, a layer of semiconductor material supported by the substrate, and said first and second terminals supported directly by the layer of semiconductor material;

further comprising using the gate terminal as a mask in a processing step to remove semiconductor material and/or dielectric material not covered by the gate terminal.

16. A method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing at least a substrate and said first and second terminals supported, either directly or indirectly, by the substrate, the first and second terminals being separated by a gap, and the first and second terminals and the gap being located over a first region of the substrate and within a perimeter of the first region;

b) forming a covering of photoresist material over at least the first region of the substrate so as to cover the first and second terminals, the gap, and any portion or portions of the first region of the substrate not located beneath the gap or the first and second terminals;

c) forming a mask on a surface of the covering of photoresist material, the mask covering at least a portion of the gap extending from the first terminal to the second terminal, at least a portion of the first terminal immediately adjacent said portion of the gap, and at least a portion of the second terminal immediately adjacent said portion of the gap;

d) exposing the structure resulting from step (c) to electromagnetic radiation from above such that the mask shields a portion of the photoresist covering under the mask from said electromagnetic radiation;

e) processing the structure resulting from step (d) to reduce a solubility of the photoresist material exposed to said electromagnetic radiation from above;

f) exposing the structure resulting from step (e) to electromagnetic radiation from below, such that the first and second terminals shield parts of the previously unexposed portion of photoresist covering from the electromagnetic radiation from below but another part of the previously unexposed portion of photoresist covering is exposed;

g) processing the photoresist material to remove photoresist material that was shielded by the mask from the electromagnetic radiation from above but exposed to electromagnetic radiation from below, to form a window in the covering of photoresist material; and h) depositing at least one of: a layer of semiconductor material; a layer of dielectric material; and a layer of conductor material, at least inside said window, to form at least one of: the semiconductor channel, gate dielectric, and gate terminal, respectively;

wherein step (a) comprises providing said substrate, and said first and second terminals supported directly by said substrate;

wherein step (h) comprises depositing a layer of semiconductor material; a layer of dielectric material; and a layer of conductor material, at least inside said window, to form the semiconductor channel, gate dielectric, and gate terminal, respectively.

17. A method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing at least a substrate, said gate terminal, a layer of semiconductor material, and a layer of dielectric material separating the gate terminal from the layer of semiconductor material, the gate terminal being supported, either directly or indirectly, by the substrate, the layer of semiconductor material comprising a channel portion, arranged over said gate terminal, a first end portion, extending from a first end of the channel portion beyond an edge of the gate terminal, and a second end portion, extending from a second end of the channel portion beyond an edge of the gate terminal, the channel portion providing said semiconductor channel and the layer of dielectric material providing said gate dielectric, and the gate terminal and the layer of semiconductor material being located over a first region of the substrate and within a perimeter of the first region;

b) forming a covering of photoresist material over at least the first region of the substrate so as to cover the gate terminal and the layer of semiconductor material and any portion or portions of the first region of the substrate not located beneath the gate or the layer of semiconductor material;

c) forming a mask on a surface of the covering of photoresist material, the mask covering the channel portion, at least part of the first end portion, and at least part of the second end portion;

d) exposing the structure resulting from step (c) to electromagnetic radiation from above such that the mask shields a portion of the photoresist covering under the mask from said electromagnetic radiation;

e) processing the structure resulting from step (d) to reduce a solubility of the photoresist material exposed to said electromagnetic radiation from above;

f) exposing the structure resulting from step (e) to electromagnetic radiation from below, such that the gate terminal shields a part of the previously unexposed portion of photoresist covering from the electromagnetic radiation from below but other parts of the previously unexposed portion of photoresist covering are exposed;

g) processing the photoresist material to remove photoresist material that was shielded by the mask from the electromagnetic radiation from above but exposed to electromagnetic radiation from below, to form a first window in the covering of photoresist material, the first window exposing at least part of the first end portion, and a second window in the covering of photoresist material, the second window exposing at least part of the second end portion; and h) depositing conductor material, at least inside said first and second windows, to form said first and second terminals respectively, the first terminal being in contact with the first end portion and the second terminal being in contact with the second end portion.

18. A method in accordance with claim 17, further comprising removing said mask before step (g).

19. A method in accordance with claim 18, wherein step (d) comprises a sub-step of removing said mask after exposing the structure resulting from step (c).

20. A method in accordance with claim 17, further comprising removing remaining material of the photoresist covering after step (h).

21. A method in accordance with claim 17, wherein said covering of photoresist material comprises a plurality of layers of photoresist material.

22. A method in accordance with claim 21, wherein said covering of photoresist material comprises a first layer of a first photoresist material, and a second layer of a second, different photoresist material.

23. A method in accordance with claim 22, wherein said first photoresist material is a lift-off resist material.

24. A method in accordance with claim 22, further comprising forming an undercut in the first layer of photoresist material inside each window before step (h).

25. A method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing a structure comprising a substrate, said first and second terminals supported, either directly or indirectly, by the substrate, and separated by a gap, a layer of semiconductor material providing the semiconductor channel extending across said gap, a layer of dielectric material covering the layer of semiconductor material to provide the gate dielectric, and a layer gate material covering the first and second terminals and the layers of semiconductor material and dielectric material;

b) forming a covering of photoresist material covering at least the layer of gate material;

c) forming a mask on a surface of the covering of photoresist material, the mask extending at least fully across a width of the semiconductor channel and covering a portion of the first terminal and a portion of the second terminal;

d) exposing the structure resulting from step (c) to electromagnetic radiation from above such that the mask shields a portion of the photoresist covering under the mask from said electromagnetic radiation;

e) processing the structure resulting from step (d) to remove the photoresist material exposed to said electromagnetic radiation from above;

f) exposing the structure resulting from step (e) to electromagnetic radiation, to which the gate material is substantially transparent, from below, such that the first and second terminals shield parts of the previously unexposed portion of photoresist covering from the electromagnetic radiation from below but another part of the previously unexposed portion of photoresist covering is exposed;

g) processing the structure resulting from step (f) to reduce the solubility of the photoresist material shielded from said electromagnetic radiation from above but exposed to said electromagnetic radiation from below;

h) exposing the structure resulting from step (g) to electromagnetic radiation from above so as to increase a solubility of the previously unexposed photoresist material;

i) processing the photoresist material to remove photoresist material that was shielded by the mask from the electromagnetic radiation from above, shielded by the first and second terminals from the electromagnetic radiation from below, and then exposed to electromagnetic radiation from above, so as to expose all of the layer of transparent gate material except for a portion of the layer of gate material covered by the portion of photoresist material having been processed to reduce its solubility; and j) removing gate material not covered by said portion of photoresist material, the method further comprising removing the mask before step (h).

26. A method in accordance with claim 25, wherein removing the mask is a sub-step of one of steps (d), (e), (f), and (g).

27. A method in accordance with claim 26, wherein removing the mask is a sub-step of step (d), performed after exposing said structure resulting from step (c).

28. A method of manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising the steps of:

a) providing at least a substrate, said gate terminal, a layer of semiconductor material, and a layer of dielectric material separating the gate terminal from the layer of semiconductor material, the gate terminal being supported, either directly or indirectly, by the substrate, the layer of semiconductor material comprising a channel portion, arranged over said gate terminal, a first end portion, extending from a first end of the channel portion beyond an edge of the gate terminal, and a second end portion, extending from a second end of the channel portion beyond an edge of the gate terminal, the channel portion providing said semiconductor channel and the layer of dielectric material providing said gate dielectric, and the gate terminal and the layer of semiconductor material being located over a first region of the substrate and within a perimeter of the first region;

b) forming a layer of conductor material over the first region of the substrate to cover the gate terminal, layer of dielectric material, and the layer of semiconductor material;

c) forming a covering of photoresist material covering the layer of conductor material;

d) forming a mask on a surface of the covering of photoresist material, the mask covering the channel portion, at least part of the first end portion, and at least part of the second end portion;

e) exposing the structure resulting from step (d) to electromagnetic radiation from above such that the mask shields a portion of the photoresist covering under the mask from said electromagnetic radiation;

f) processing the structure resulting from step (e) to remove the photoresist material exposed to said electromagnetic radiation from above and expose conductor material not located under said mask;

g) exposing the structure resulting from step (f) to electromagnetic radiation, to which the conductor material is substantially transparent, from below, such that the gate terminal shield a part of the previously unexposed portion of photoresist covering from the electromagnetic radiation from below but other parts of the previously unexposed portion of photoresist covering are exposed;

h) processing the structure resulting from step (g) to reduce the solubility of the photoresist material shielded from said electromagnetic radiation from above but exposed to said electromagnetic radiation from below;

i) exposing the structure resulting from step (h) to electromagnetic radiation from above so as to increase a solubility of the previously unexposed photoresist material;

j) processing the photoresist material to remove photoresist material that was shielded by the mask from the electromagnetic radiation from above, shielded by the gate terminal from the electromagnetic radiation from below, and then exposed to electromagnetic radiation from above, so as to form a window in the layer of photoresist material exposing the surface of a portion of the layer of conductor material over the gate terminal; and removing exposed conductor material, the method further comprising removing said mask before step (i).

29. A method in accordance with claim 28, wherein removing the mask is a sub-step of one of steps (e), (f), (g), and (h).

30. A method in accordance with claim 29, wherein removing the mask is a sub-step of step (e), performed after exposing said structure resulting from step (d).

* * * * *